(12) United States Patent
Liu et al.

(10) Patent No.: US 9,391,068 B2
(45) Date of Patent: Jul. 12, 2016

(54) POWER RECTIFIER USING TUNNELING FIELD EFFECT TRANSISTOR

(71) Applicant: The Penn State Research Foundation, University Park, PA (US)

(72) Inventors: Huichu Liu, State College, PA (US); Ramesh Vaddi, Andhra Pradesh (IN); Vijaykrishnan Narayanan, State College, PA (US); Suman Datta, Port Matilda, PA (US)

(73) Assignee: The Penn State Research Foundation, University Park, PA (US)

( * ) Notice: Subject to any disclaimer, the term of this patent is extended or adjusted under 35 U.S.C. 154(b) by 156 days.

(21) Appl. No.: 14/456,303

(22) Filed: Aug. 11, 2014

(65) Prior Publication Data

US 2015/0043260 A1 Feb. 12, 2015

Related U.S. Application Data

(60) Provisional application No. 61/864,807, filed on Aug. 12, 2013.

(51) Int. Cl.
| | |
|---|---|
| *H02M 3/335* | (2006.01) |
| *H01L 27/06* | (2006.01) |
| *H02M 7/219* | (2006.01) |
| *H01L 27/08* | (2006.01) |

(52) U.S. Cl.
CPC ........ *H01L 27/0629* (2013.01); *H01L 27/0814* (2013.01); *H01L 27/0817* (2013.01); *H02M 7/219* (2013.01); *H02M 2007/2195* (2013.01); *Y02B 70/1408* (2013.01)

(58) Field of Classification Search
CPC ............... G05F 3/18; G05F 3/22; G05F 3/30; G05F 3/262; G05F 3/265; H02M 3/33592; H02M 7/06; H02M 7/15; H02M 7/046; H02M 7/217; H02M 7/219; H02M 2007/2195; H01L 27/0629; H01L 27/0814; H01L 27/0817; Y02B 70/1408
USPC ............. 363/114, 127; 323/311, 315; 257/30, 257/38, 39, 104, 105, 192
See application file for complete search history.

(56) References Cited

U.S. PATENT DOCUMENTS

| | | | | |
|---|---|---|---|---|
| 8,471,329 | B2 * | 6/2013 | Bhuwalka | H01L 29/7391 257/327 |
| 9,252,250 | B2 * | 2/2016 | Zhang | H01L 29/66356 |
| 2014/0301121 | A1 * | 10/2014 | Rehem | H02M 7/32 363/110 |
| 2015/0043260 | A1 * | 2/2015 | Liu | H01L 27/0629 363/127 |
| 2015/0333534 | A1 * | 11/2015 | Liu | H02J 5/005 307/104 |

* cited by examiner

*Primary Examiner* — Yemane Mehari
(74) *Attorney, Agent, or Firm* — Buchanan Ingersoll & Rooney PC

(57) ABSTRACT

A power rectifier includes a stage having a first Tunneling Field-Effect Transistor ("TFET") having a source, a gate, and a drain, a second TFET having a source, a gate, and a drain, a third TFET having a source, a gate, and a drain, and a fourth TFET having a source, a gate, and a drain such that the source of the first TFET, the source of the second TFET, the gate of the third TFET, and the gate of the fourth TFET are connected, the gate of the first TFET, the gate of the second TFET, the source of the third TFET and the source of the fourth TFET are connected, the drain of the first TFET and the drain of the third TFET are connected, and the drain of the second TFET and the drain of the fourth TFET are connected. Alternative embodiments are also disclosed.

17 Claims, 14 Drawing Sheets

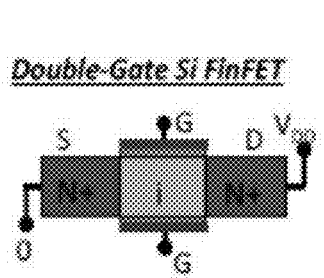
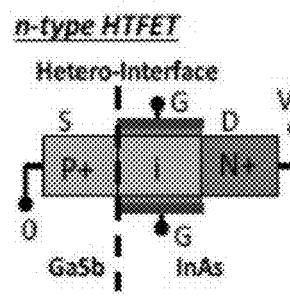
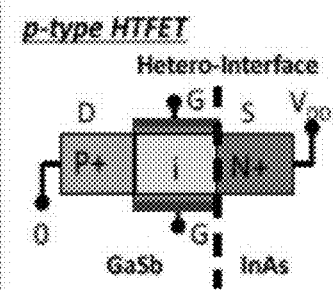
Fig. 1a
(Prior Art)
Fig. 1b
(Prior Art)
Fig. 1c
(Prior Art)
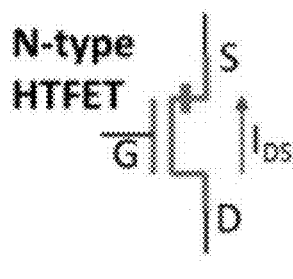
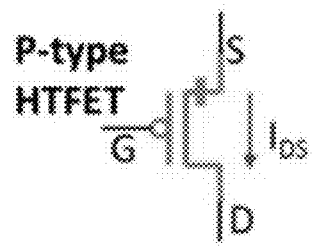
Fig. 2a
(Prior Art)
Fig. 2b
(Prior Art)

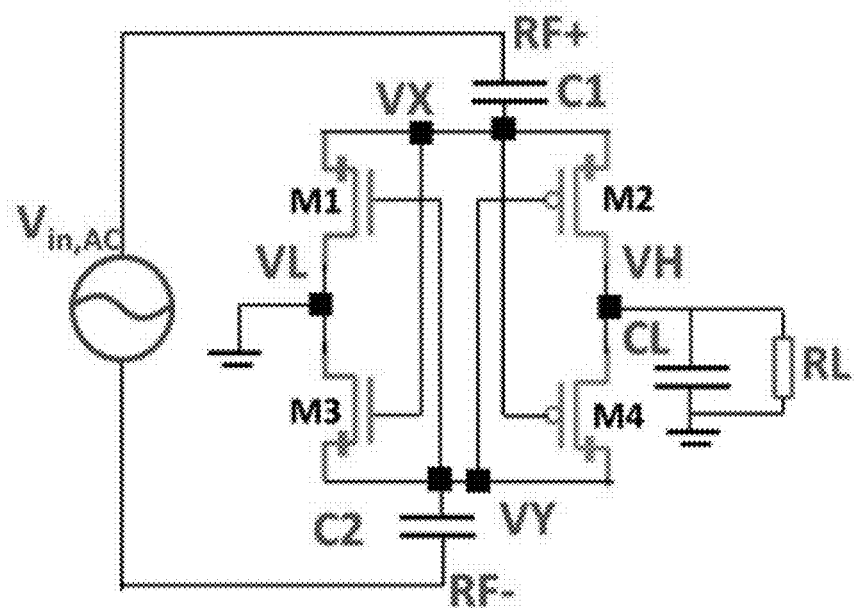
Fig. 3
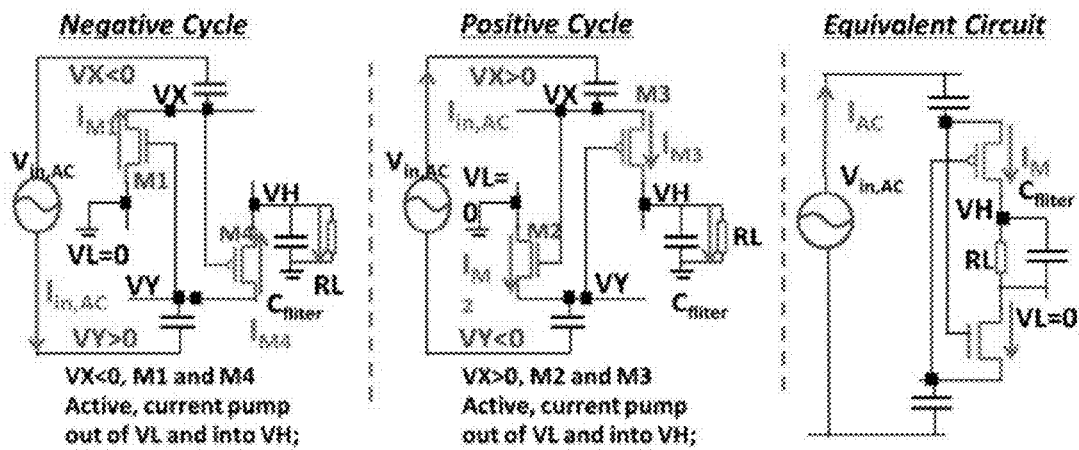
Fig. 4a | Fig. 4b | Fig. 4c

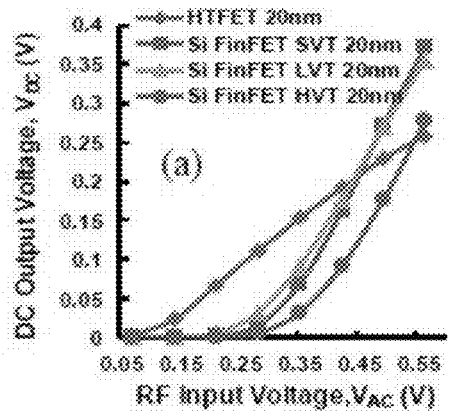 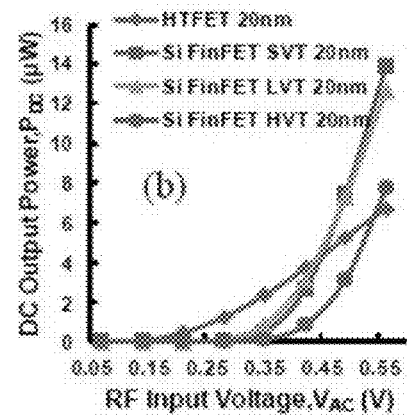
Fig. 10a                Fig. 10b
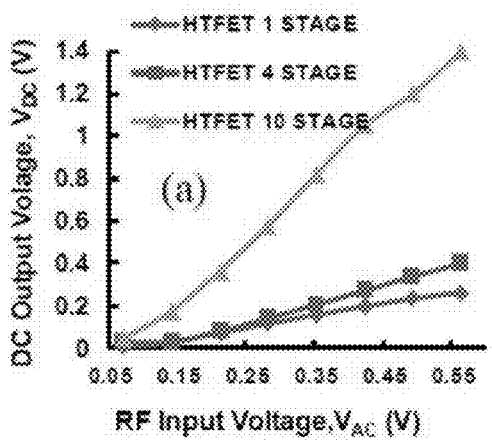 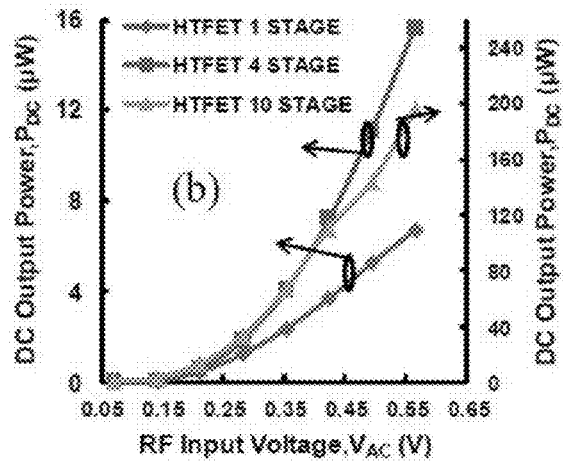
Fig. 11a                Fig. 11b

POWER RECTIFIER USING TUNNELING FIELD EFFECT TRANSISTOR

CROSS-REFERENCE TO RELATED APPLICATION

This application claims priority to U.S. Provisional Patent Application No. 61/864,807 filed on Aug. 12, 2013.

FIELD OF THE INVENTION

The present disclosure is generally directed towards systems and methods for low power Radio Frequency Identification ("RFID") circuit design using Hetero-junction Tunnel Field Effect Transistors ("HTFET").

BACKGROUND OF THE INVENTION

Radio Frequency Identification ("RFID") systems typically include RFID tags and RFID readers. RFID systems can be used in many ways for locating and identifying objects to which the tags are attached. RFID systems are particularly useful in product-related and service-related industries for tracking objects being processed, inventoried, or handled. In such cases, an RFID tag is usually attached to an individual item, or to its package.

Typically RFID systems use an RFID reader to interrogate one or more RFID tags. The reader transmits a Radio Frequency ("RF") signal and performs the interrogation. The RF signal is an electromagnetic signal that is sensed by a tag that responds by transmitting back another RF signal. The tag generates the transmitted RF signal RF either originally, or by reflecting back a portion of the interrogating RF signal.

The RF signal that is reflected back by the tag may further encode data stored internally in the tag, such as a number. The data of the reflected signal is decoded by the reader, which thereby identifies, counts, or otherwise interacts with an item associated with tag. The decoded data could denote a serial number, a price, a date, a destination, other attribute(s), any combination of attributes, and so on.

An RFID tag typically includes an antenna system, a radio section, a power section, and frequently a logic section, a memory, or both. In early RFID tags, the power section was made up of an energy storage device, such as a battery. RFID tags with an energy storage device are known as active or semi-active tags. However, advances in semiconductor technology have allowed RFID tags to be designed such that they can be powered solely by an RF signal received by the RFID tag. Such RFID tags do not include an energy storage device, and are thus called passive tags.

Harvesting sufficient power from the RF signal can be difficult since the voltage of the RF signal may be in the range of approximately 200 mV, and a typical supply voltage for circuits of the RFID tag is 1 V. If the amplitude of the signal is insufficient to operate the RFID tag, a power rectifier circuit may be used to increase the output DC voltage. The rectifiers in these systems must extract enough DC power from incident radiation to power the circuitry on the tag. However, rectification is difficult when the incident power levels are very low. Therefore, most rectifiers have an unresponsive dead zone at low voltage amplitudes. Small turn-on voltage of devices is one of the most important factors in rectifier design. This makes steep slope devices such as Tunnel or Tunneling Field Effect Transistors ("TFET") attractive device options for this application.

Alternately, several compensation techniques have also been proposed recently to reduce the effective threshold voltage. However, these compensation techniques still need to deal with several issues, such as sensitivity to leakage current. Recent rectifier studies have focused on maximizing Power Conversion Efficiency ("PCE") and output power, but not much on rectifier sensitivity. More emphasis has been placed on optimizing rectifier sensitivity with little emphasis on PCE and DC output power levels. PCE of a rectifier circuit is also affected by several parameters such as circuit topology, diode-device parameters, input RF signal frequency, amplitude, and output loading conditions.

Current passive RFID tags typically limit the communication range of an RFID to less than 3 meters. There are few rectifier topologies proposed so far which can perform efficiently at microwatts (1-100 µW) of available RF power with higher sensitivity and providing long range RF communication. Therefore, a design need is present for a passive RFID rectifier with high PCE, high sensitivity for long-range communication.

SUMMARY OF THE INVENTION

Hetero-junction Tunnel FET ("HTFET") for ultra-low power RF circuit design has been explored at the device and circuit level. Our evaluation of an HTFET based rectifier demonstrates its promise compared to other passive RFID devices. With a 10-stage optimized TFET rectifier at 915 MHz, PCE of 98% with 0.5 nW power consumption, sensitivity of −24 dBm for 9 µW $P_{DC}$ and sensitivity of −33 dBm for 0.4 µW $P_{DC}$ were achieved.

In a present preferred embodiment of a Tunnel Field Effect Transistor ("TFET") based ultra-low power high sensitivity RF rectifier, demonstrated through device-circuit simulation, a 10-stage optimized TFET RF rectifier operates at 915 MHz with a power conversion efficiency of 98% with 0.5 nW power consumption, sensitivity of −24 dBm for 9 pW of DC power and sensitivity of −33 dBm for 0.4 pW DC power.

In a battery-less system, an RF signal with an AC amplitude aspect is converted to DC by rectifier circuits. Accordingly, the rectifiers in this type of system must be designed to extract enough DC power from the incident radiation that is the RF signal to power the circuitry on an RFID tag. Rectification is difficult when incident power levels are very low and most rectifiers have an unresponsive dead zone at low voltage amplitudes. The TFET based RF rectifier design of the present invention is based on the steep switching HTFET to enable low voltage, ultra-low power operation with high Power Conversion Efficiency ("PCE"). Due to TFET unidirectional conduction, low turn-on voltage and steep switching characteristics, a specific design was employed and optimized to realize optimal performance.

An HTFET rectifier design of the present invention shows 25-50% larger DC rectified output power in comparison to known Si FinFET circuit topology. With a 10-stage optimized TFET rectifier at 915 MHz, a PCE of 98% with 0.5 nW power consumption, a sensitivity of −24 dBm for 9 µW $P_{DC}$ (with free-space communication range of ~30 m) and a sensitivity of −33 dBm for 0.4 µW $P_{DC}$ (with free-space communication range of ~90 m) is achieved. Thus, the HTFET based rectifier of the design of the present invention is very promising for a battery-less energy harvesting system in an on-chip application.

Irrespective of tuning of the threshold voltage, $V_{th}$, of a Si FinFET, an HTFET rectifier of the present invention has performance that is superior for rectifying weak RF input signals. An HTFET rectifier embodying the present invention has been shown to have 25-50% larger DC rectified output power in comparison to Si FinFET topology due to the steep switching, improved on-state current, $I_{on}$, at low $V_{CC}$ and uni-directional conduction. A design parameter optimization specific to a TFET rectifier was also developed. The optimized TFET rectifier has 8.4 times larger DC output voltage, 69.5 times larger DC output power with larger PCE values in comparison to a non-optimized case. With a 10-stage optimized TFET rectifier at 915 MHz, PCE of 98% with 0.5 nW power consumption, sensitivity of −24 dBm for 9 μW $P_{DC}$ (with free-space communication range of ~30 m) and sensitivity of −33 dBm for 0.4 μW $P_{DC}$ (with free-space communication range of ~90 m) is achieved.

BRIEF DESCRIPTION OF THE DRAWINGS

Further possible embodiments are shown in the drawings. The present invention is explained in the following in greater detail as an example, with reference to exemplary embodiments depicted in drawings. In the drawings:

FIG. 1a is a representation of a Si FinFET that was used for comparison of preferred embodiments of the present invention;

FIG. 1b is a representation of an n-type HTFET that is used in preferred embodiments of the present invention;

FIG. 1c is a representation of a p-type HTFET that is used in preferred embodiments of the present invention;

FIG. 2a is a circuit element diagram of an n-type HTFET that is used in preferred embodiments of the present invention;

FIG. 2b is a circuit element diagram of a p-type HTFET that is used in preferred embodiments of the present invention;

FIG. 3 is a circuit diagram of a TFET rectifier embodying the present invention;

FIG. 4a is a circuit diagram of a TFET rectifier embodying the present invention;

FIG. 4b is a circuit diagram of a TFET rectifier embodying the present invention;

FIG. 4c is a circuit diagram of a TFET rectifier embodying the present invention;

FIG. 10a is graph of a comparison of DC output voltages of an HTFET rectifier embodying the present invention and various Si FinFET rectifiers with different threshold voltages, $V_{th}$;

FIG. 10b is graph of a comparison of and DC output power response of an HTFET rectifier embodying the present invention and various Si FinFET rectifiers with different threshold voltages, $V_{th}$;

FIG. 11a is graph of DC output voltage of a TFET Rectifier Topology in multi-stage configuration embodying the present invention;

FIG. 11b is graph of DC output power of a TFET Rectifier Topology in multi-stage configuration embodying the present invention;

DETAILED DESCRIPTION OF THE INVENTION

Figure 5:
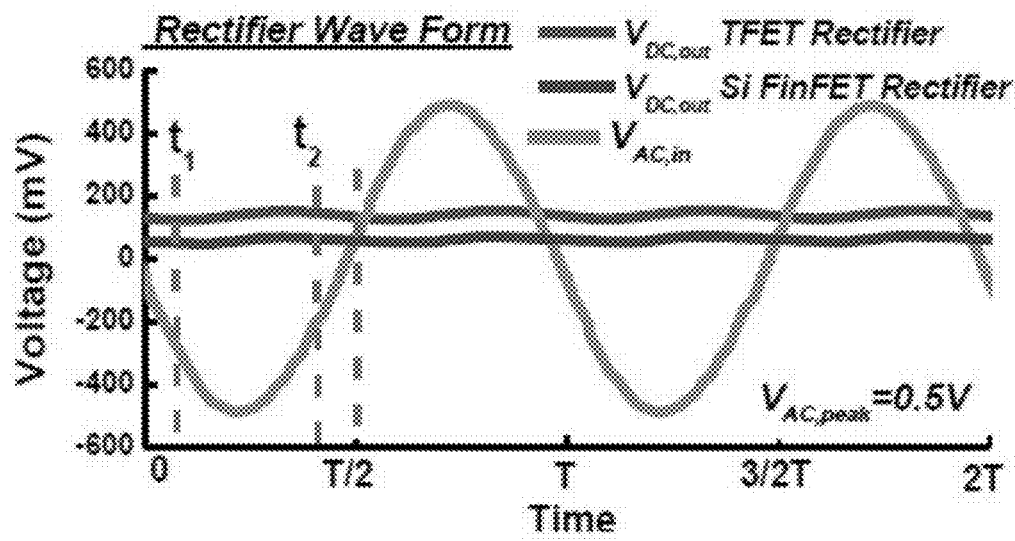
FIG. 5 is a graph of a rectifier input signal during a period of [0, T]

As shown in FIGS. 1b and 1c, a Tunneling Field Effect Transistor ("TFET") can be seen as a reverse-biased, gated p-i-n tunnel diode with asymmetrical source/drain doping. The reverse biased diode leakage determines the current in the off-state, or $I_{off}$, of the TFET. The on-state is enabled by the gate-controlled band-to-band tunneling at the source-channel junction, and a sub-60 mV/decade steep-slope can be achieved in TFET with desired Ion/Ioff over a low power supply, or $V_{CC}$, range. Moreover, with the introduction of materials from group III and group V of the periodic table (III-V materials) and a heterojunction, a III-V Hetero-junction TFET ("HTFET") exhibits improved energy efficiency for below 0.5V $V_{CC}$ compared to the state-of-art CMOS technology.

As disclosed herein, a stage of a power rectifier may include a first P-type TFET connected in series with a second P-type TFET and a first N-type TFET connected in series with a second N-type TFET. The first and second P-type TFETs are connected in parallel with the first and second N-type TFETs. The first P-type TFET is controlled by a source voltage of the second P-type TFET, the second P-type TFET is controlled by a source voltage of the first P-type TFET, the first N-type TFET is controlled by a source voltage of the second N-type TFET, and the second N-type TFET is controlled by a source voltage of the first N-type TFET.

According to the preferred embodiment of FIG. 3, a power rectifier comprises a stage that includes a first, a second, a third, and a fourth, Tunneling Field-Effect Transistor ("TFET"), labeled M1, M2, M3, and M4 respectively, each having a source, a gate, and a drain. Further, the first (M1) and third (M3) TFETs are N-type TFETs, exemplified in FIG. 2a, and the second (M2) and fourth (M4) are P-type TFETs, exemplified in FIG. 2b. As shown in FIG. 3, the source of the first TFET, the source of the second TFET, the gate of the third TFET, and the gate of the fourth TFET are connected at a first node that has a reference voltage VX, the gate of the first TFET, the gate of the second TFET, the source of the third TFET and the source of the fourth TFET are connected at a second node that has a reference voltage VY, the drain of the first TFET and the drain of the third TFET are connected at a third node that has a reference voltage VL, and the drain of the second TFET and the drain of the fourth TFET are connected at a fourth node that has a reference voltage VH.

Furthermore, as demonstrated in FIG. 3, the source of the first TFET, the source of the second TFET, the gate of the third TFET, and the gate of the fourth TFET may be connected to a first capacitor, labeled C1, based on the first node having reference voltage VX, and the gate of the first TFET, the gate of the second TFET, the source of the third TFET, and the source of the fourth TFET may be connected to a second capacitor, labeled C2, based on the second node having a reference voltage VY.

Further, as shown in FIG. 3, the input node can be configured to receive an alternating signal and the first capacitor is connected to the input node. In addition, the drain of the first TFET and the drain of the third TFET may be connected to ground and the drain of the second TFET and the drain of the fourth TFET may be connected to a load resistance RL. Also, a third capacitor CL may be connected in parallel to the load resistance RL. Each of the first TFET, the second TFET, the third TFET, and the fourth TFET may be a Hetero-Junction TFET ("HTFET").

Additionally, multi-stage configurations of a TFET rectifier can achieve large output DC voltages when serially stacked along a DC path and connected in parallel to the input RF terminals of a stage. The stage shown in FIG. 3 may be considered to be a first stage having a first reference voltage node that is also an input node RF+ and a second reference voltage node RF−. A power rectifier according another preferred embodiment may comprise a second stage that has a first reference voltage node and a second reference voltage node similar to the first stage. The second stage would comprise the same number and type of TFETs along with the same connections as the first stage. In addition, the first reference voltage node of the second stage is connected to the input node of the first stage and, similar to the first capacitor C1 shown in FIG. 3, a capacitor may be connected in parallel between the input node of the first stage and the first reference voltage node of the second stage. As discussed below, a multi-stage device having 4, 10, and 15 stages connected in parallel has been shown to be a particularly effective design.

FIGS. 4a-4c also shows the design of the TFET based 4-transistor differential drive rectifier topology. An RF signal acts as a differential input signal $V_{in, AC\ and}$ is applied across reference voltage nodes RF+ and RF−. Thus a DC output voltage, $V_{out,\ DC}=V_H$, develops across the load impedance $R_L$. With regard to FIG. 4b, during the positive half of the voltage input cycle, the reference voltage between reference voltage end RF+ and reference voltage end RF− increases beyond the rectifier device threshold. Accordingly, the second TFET, labeled M2, and the third TFET, labeled M3, will switch on, allowing current to flow into the load RL, while the first TFET, labeled M1, and the fourth TFET, labeled M4, will both remain off.

In relation to FIG. 4a, continuing through the voltage input cycle, the reference voltage different between RF+ and RF− drops below the rectifier device threshold, M2 and M3 will turn off until the difference between RF+ and RF− becomes more negative than a negative value of the threshold voltage, −Vth. At that point M1 and M4 turn on and rectify the negative half of the incoming RF signal. Since $V_L$ is ground in 1-stage rectifier, an effective ground can be introduced to get the equivalent circuit shown in FIG. 4c.

Theoretical Analysis

An exemplary embodiment of the present invention is provided in comparison to a baseline, for which a Si FinFET device is used. The comparison was made using a Verilog-A model in a TCAD Sentauraus modeling environment. FIG. 5 shows a rectifier input signal $V_{AC,\ in}$, the DC output voltage $V_{DC,\ out}$ during [0, T] for Si FinFET and TFET. In addition, t1, t2 are illustrated at $V_{AC,\ in}$ is equal to the threshold voltage of a Si FinFET device, $V_{th,\ Si\ FinFET}$. The full-wave range of the AC input signal is utilized and essentially works as a charge pump to the load resistance, RL in FIGS. 3-4c. As the net charge Q transfer to the load determines $V_{DC,\ out}$, that effect is illustrated based on the formula below:

$$Q_{VRF_+<0} = Q_{M1,Frd} - Q_{M1,Rev} = Q_{M4,Frd} - Q_{M4,Rev} \tag{1}$$

$$Q_{VRF_+>0} = Q_{M2,Frd} - Q_{M2,Rev} = Q_{M3,Frd} - Q_{M3,Rev} \tag{2}$$

$$Q_{VRF_+<0} + Q_{VRF_+>0} = \frac{V_{DC,out}}{R_L}T \tag{3}$$

$Q_{VRF+<0}$ and $Q_{VRF+>0}$ are the net charge transferred to the load at the negative cycle and positive cycle of $V_{in, AC}$, respectively. $Q_{M1,\ Frd}$ and $Q_{M1,\ Rev}$ are the forward (when $V_{GS}>0$) and reverse operations (when $V_{GS}<0$) induced charge transfer due to the first TFET M1 of FIG. 3, respectively, and similar terms are applied to the other TFETs M2, M3 and M4, shown in FIG. 3. T is the period of the input RF signal. To analyze $V_{DC,\ out}$ and PCE of the TFET rectifier shown in FIG. 3, M1's operation during 1 signal cycle, [0,T], is compared with the operation of an Si FinFET rectifier in the same configuration as FIG. 3. The terminal voltages $V_{GS,\ M1}$ and $V_{DS,\ M1}$ can be expressed for both Si FinFET and TFET rectifiers as:

$$V_{GS,M1} = V_Y - V_X = -V_{in,AC} \tag{4}$$

$$V_{DS,M1} = -V_X = -\frac{1}{2}V_{in,AC} = \frac{1}{2}V_{GS,M1} \tag{5}$$

With the formulas and functions described in this section, M1 is considered to be a first TFET in a TFET rectifier and M1 is also used as a first Si FinFET in a Si FinFET rectifier that is configured as in FIG. 3. The device operates at linear region due to the equation (5) at the on-state. Since a p-type FET with the same drive strength is assumed, the matched $V_{th}$ of a p-type FET and n-type FET eliminates the operation region differences of M1, M4 pair as well as M2, M3 pair. Taking the Si FinFET rectifier as baseline, M1 operation in [0, T], as associated with the Rectifier waveforms shown in FIG. 5, can be divided into four categories; subthreshold [0, t1], linear region [t1, t2], subthreshold [t2, T/2], off-state [T/2, T].

Subthreshold Operation in [0, t1] and [t2,T/2]

For $-V_{in,\ AC} < V_{th,\ SiFinFET}$, a formula representing subthreshold operation is as follows:

$$I_{M1,FinFET} = I_{sub,Vth} \approx I_0 * 10^{\frac{V_{GS,M1}}{n*2.3*V_t}} = I_0 * 10^{\frac{-V_{in,AC}}{SS_{FinFET}}} \quad (6)$$

$$I_{M1,TFET} \approx I_1 * 10^{\frac{-V_{in,AC}}{SS_{TFET}}} \quad (7)$$

$V_t$ is approximately equal to a 26 mV thermal voltage, n is the body factor, and $I_0$ represents the zero-bias leakage for each of the Si FinFET and TFET devices respectively, and $I_{sub,\ Vth}$ is the subthreshold current. Since $SS_{FinFET}$>60 mV/decade and the average of $SS_{TFET}$ is nearly 30 mV/decade, |IM1, TFET|>|IM1,SiFinFET| when $-V_{in,AC} < V_{th,\ SiFinFET}$. A similar analysis is applied to [t2, T/2].

Linear Operation in [t1, t2]

Since $V_{GS,\ M1} = 2V_{DS,\ M1}$, when $-Vin, AC > V_{th,\ SiFinFET}$, a formula representing linear operation is as follows:

$$I_{M1,SiFinFET} = I_{Linear} < I_{M1,TFET} \text{ when } |V_{in,AC}| < 0.5V \quad (8)$$

$$I_{M1,SiFinFET} = I_{Linear} > I_{M1,TFET} \text{ when } |V_{in,AC}| > 0.5V \quad (9)$$

$I_{Linear}$ is the device current at the linear region (triode mode).

Reverse Conduction in [T/2,T]

In the period section [T/2, T], VX>0, and ideally M1 is off initially with only leakage power loss caused by the off-state current, $I_{off}$. As the $V_{DC,\ out}$ increases until a state to state output is formed, a common voltage will be developed for VX and VY, shown as a DC component in FIG. 5. For Si FinFET, $V_{GD,\ M1}$ can be positive, then M1 is turned on when $V_{SD,M1}$>0. Since MOSFET is symmetrical, a reverse leakage exists in the Si FinFET device but is eliminated in a TFET.

TFET $V_{DC,\ out}$ Analysis

To estimate the net charge transfer, first the current of TFET, $I_{M1}$, is integrated over [0, T/2]:

$$Q_{M1,Frd} = \int_0^{\frac{T}{2}} I_{M1}(t)V_{in}(t)\,dt \quad (10)$$
$$= \int_0^{t1} I_{Sub,Vth}(t)V_{in}(t)\,dt + \int_{t1}^{t2} I_{Linear}(t)V_{in}(t)\,dt +$$
$$\int_{t2}^{T/2} I_{Sub,Vth}(t)V_{in}(t)\,dt$$

According to formulas shown above as (6) and (7), the steep switching of TFET leads to significant improvement of $I_{M1}$ at low values of the input voltage $V_{in,\ AC}$ compared to subthreshold Si FinFET voltage as well as an improvement of both input power utilization and charge transfer in period sections of [0, t1] and [t2, T/2]. According to the formulas shown above as (8) and (9), in [t1, t2], M1 is turned on and operating in the linear region for Si FinFET. At this point, the TFET rectifier shows higher on-state current, $I_{on}$, compared to Si FinFET at $V_{CC}$<0.5V, but loses the energy efficiency at high $V_{CC}$ due to tunneling process limitation. Therefore, at low input voltage $V_{in,\ AC}$, a TFET rectifier can achieve higher peak current $I_{M1}$, but has lower peak $I_{M1}$ at high $V_{in,\ AC}$ compared to a Si FinFET rectifier.

Figure 6A:
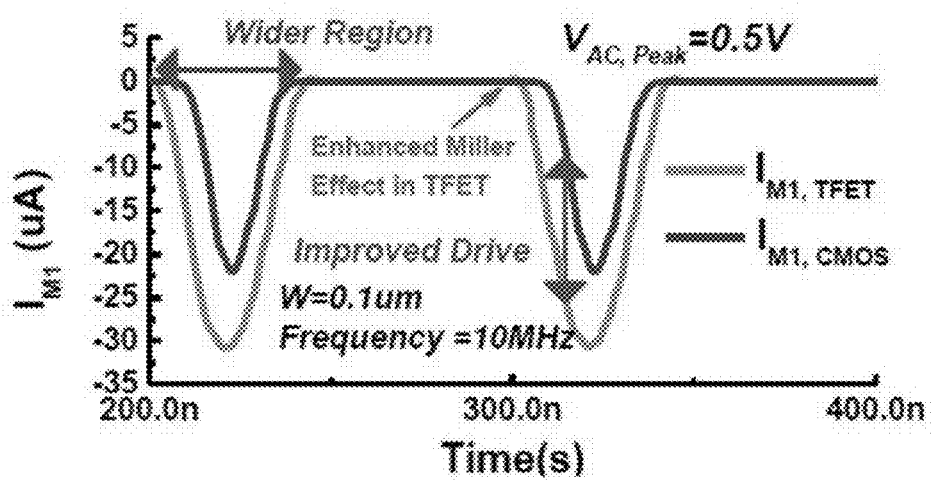
FIG. 6a is graph of a comparison of the current through device M1 at an input voltage of 0.5V AC for TFET rectifier embodying the present invention and a Si FinFET rectifier.
Figure 6B:
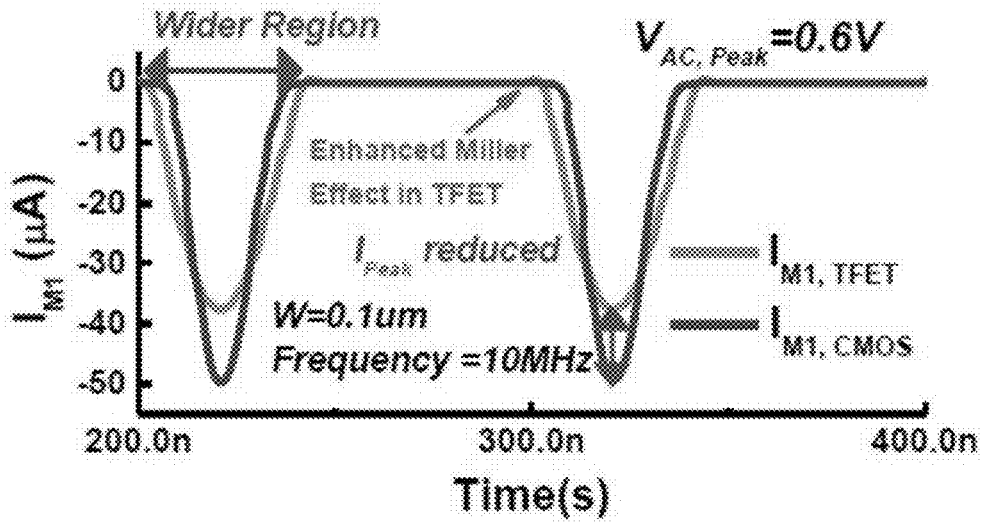
FIG. 6b is a graph of a comparison of the current through device M1 at an input voltage of 0.6V AC for TFET rectifier embodying the present invention and a Si FinFET rectifier.

FIGS. 6a and 6b show the comparison $I_{M1}$ (in μA) of a Si FinFET and an HTFET for input voltages having amplitudes of 0.5V and 0.6V, respectively. FIGS. 6a and 6b show the comparison $I_{M1}$ of Si FinFET and HTFET where the channel width ("W") of both the Si FinFET and HTFET is 0.1 μm and the input signal has a frequency of 10 MHz. For both 0.5V and 0.6V operation, an HTFET show earlier "turn-on" compared to Si FinFET due to steep-slope with improved utilization of the input signal. At 0.5V input, HTFET shows improved $I_{M1}$, and reduced peak $I_{M1}$ at 0.6V input. As a result, in the half-cycle input, $Q_{M1,\ Forward}$ in HTFET will be higher at low $V_{in,\ AC}$, but will be reduced at high $V_{in,\ AC}$ due to a low $I_{on}$ compared to Si FinFET.

In the period section [T/2, T], M1 is at the off-state, the $I_{off}$ and reverse conduction $I_{Rev(t)}$ induced charge transfer is represented by the formula:

$$Q_{M1,Rev} = \int_{T/1}^{T}(I_{Rev}(t) + I_{OFF})V_{in}(t)dt \quad (11)$$

$I_{Rev(t)}$ in the Si FinFET rectifier can be eliminated with the replacement of TFET because of the uni-directional conduction aspect of the TFET. With the fixed $I_{off}$ of the TFET, $Q_{M1,\ Rev}$ is thus reduced or nearly eliminated in a TFET.

Assuming M1 and M3, and M2 and M4 are identical, using the formula represented as (3) above, $V_{DC,\ out}$ becomes:

$$V_{DC,out} = \frac{R_L}{T} * 2 * (Q_{M1,Frd} - Q_{M1,Rev}) \quad (12)$$
$$= (2V_{RF} - V_{drop})$$

$V_{RF}$ is the RMS value of the input signal and $V_{drop}$ is the voltage loss across the rectifier. With the same load and signal frequency, $V_{drop}$ due to the inefficient utilization of the input is reduced in a FET rectifier, leading to the improved $V_{DC,\ out}$ at low $V_{in,\ AC}$ compared to a Si FinFET rectifier.

Design Analysis

PCE Analysis

Power Conversion Efficiency ("PCE") of the rectifier discussed above can be expressed as:

$$PCE = \frac{P_{DC,out}}{P_{RF,in}} \quad (13)$$
$$= \frac{I_{DC,out}V_{DC,out}}{\frac{1}{T}\int_0^T I_{in,AC}(t)V_{in,AC}(t)\,dt}$$
$$= \frac{\frac{V_{DC,out}^2}{R_L}}{\frac{V_{DC,out}^2}{R_L} + P_{Loss}}$$

$$P_{Loss} = P_{Leakage} + P_{Reverse} + P_{switching} + P_{Ron} \quad (14)$$

$$P_{switching} = 1/T(W_{M1}C_{gg,M1} + M_{M4}C_{gg,M4})V_{DC,out}^2 \quad (15)$$

$$P_{Ron} = 2 * (I_{M1}^2 R_{on,M1} + I_{M4}^2 R_{on,M4}) \quad (16)$$

$P_{DC,\ out}$, $P_{RF,\ in}$ and $P_{Loss}$ represent the output DC power, input RF power and the power loss, respectively. And $I_{in,\ AC}$ is the current flowing through a branch. The power loss sources considered in the following analysis are leakage power, $P_{Leakage}$, reverse conduction power, $P_{Reverse}$, device capacitance switching induced dynamic power, $P_{switching}$, and the on resistance induced thermal power loss, $P_{Ron}$. $W_{M1}$ and $W_{M4}$ represent the device width, and $C_{gg, M1}$ and $C_{gg, M4}$ represent the total capacitance of M1 and M4.

Due to the fixed $I_{off}$ for a TFET and Si FinFET, $P_{Leakage}$ in [T/2, T] are comparable. However, a TFET's uni-directional conduction characteristic can significantly reduce the reverse conduction induced leakage and power loss $P_{Reverse}$, hence improving the PCE. The improved power utilization and reduced power loss can improve the $V_{DC, out}$ for TFET rectifier at low $V_{in, AC}$. A TFET also shows an enhanced Miller capacitance effect, which can be described as a higher gate-drain $C_{gd}$ component and suppressed gate-source $C_{gs}$ in total gate capacitance $C_{gg}$. This effect can cause a transient current "spike" during switching, which induces an increased $P_{switching}$. In the following evaluation of a simulated TFET rectifier, PCE is compared with $V_{in, AC}$ to evaluate the rectifier's performance.

Figure 7:
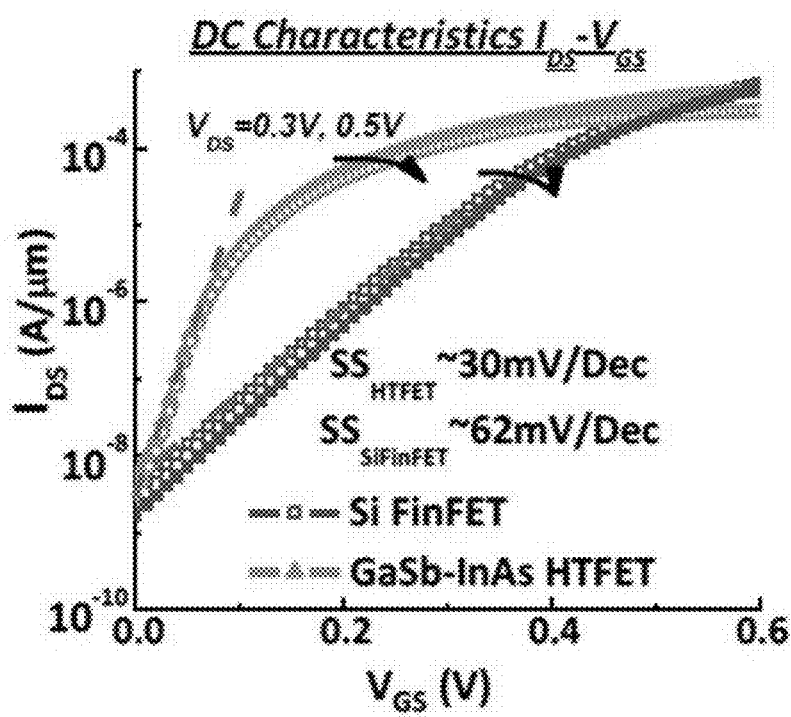
FIG. 7 is graph of a comparison of drain to source current, $I_{ds}$, and gate to source voltage, $V_{gs}$, for a HTFET used in preferred embodiments of the present invention and an Si FinFET.

An exemplary embodiment of the present invention is provided in comparison to a baseline of a Si FinFET device. The comparison was made using a Verilog-A model in a TCAD Sentauraus modeling environment. As shown in FIG. 7, for Low Operating Power ("LOP") operation, a HTFET with a gate-length of 20 nm shows 7 times on-current improvement over an Si FinFET at $V_{CC}$=0.3V with an average Subthreshold Swing ("SS") of 30 mV/decade over 2 decades of the current change. Off-state current, $I_{off}$, for both the HTFET and Si FinFET, is 5 nA/μm. In the models tested, the TFET and Si FinFET models were tuned to have a fixed $I_{off}$ at $V_{DS}$=0.5 V. Since the p-type TFET solution is still in development, symmetrical p-type device performance with the same drive strength was assumed for both the Si FinFET device and the HTFET device.

Power Conversion Efficiency ("PCE") is the ratio of the average output power at a load to the average real input power to a rectifier. It has been found that a transistors' on-resistance, $R_{on}$, and reverse conduction induce a voltage drop, $V_{drop}$, as well as a power loss across a rectifier. Thus, a higher $R_{on}$ value and higher reverse conduction value will reduce the output voltage range and the power delivered to a load.

Figure 8A:
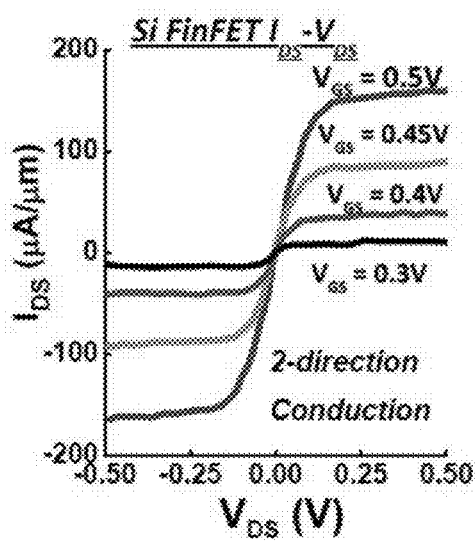
FIG. 8a is graph is graph of the drain to source current, $I_{ds}$, and drain to source voltage, $V_{ds}$, for an Si FinFET.
Figure 8B:
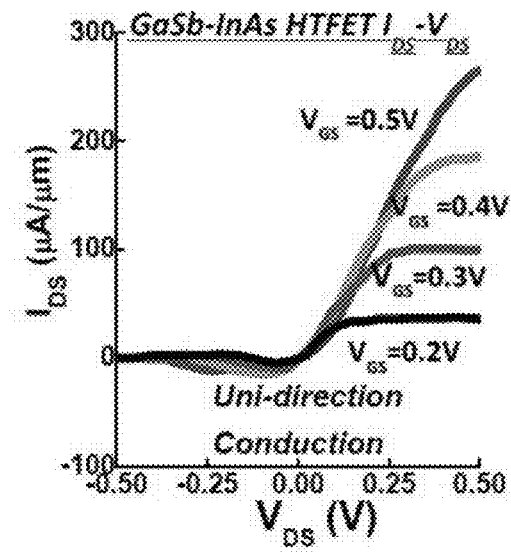
FIG. 8b is graph is graph of the drain to source current, $I_{ds}$, and drain to source voltage, $V_{ds}$, for an HTFET used in preferred embodiments of the present invention.
Figure 9A:
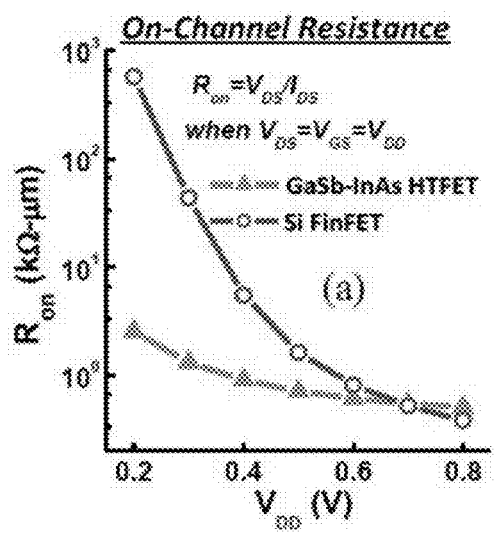
FIG. 9a is graph of a comparison of on-channel resistance versus supply voltage comparing a Si FinFET and an HTFET used in preferred embodiments of the present invention.
Figure 9B:
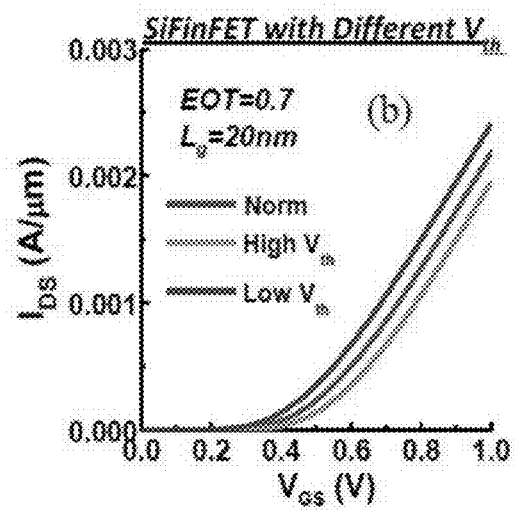
FIG. 9b is graph of drain to source current, $I_{ds}$, and gate to source voltage, $V_{gs}$, for Si FinFET models with different threshold voltages, $V_{th}$.

As shown in FIG. 8b, an HTFET exhibits uni-directional conduction characteristics due to the p-i-n device structure when compared to a Si FinFET. The uni-directional conduction characteristics reduce reverse-conduction induced power loss. Additionally, FIG. 9a shows that an HTFET has lower $R_{on}$ compared to an Si FinFET (shown in FIG. 9b) due to the steep slope switching, i.e. a high current drive at low $V_{cc}$. The steep slope switching can improve the PCE of a rectifier for a fixed load. Another benefit from the steep slope switching is the reduced "turn-on" voltage, which can lead to the improved output voltage $V_{DC, out}$. It should be noted that since a threshold voltage, $V_{th}$, definition for TFET varies due to the tunneling mechanism, the term, "turn-on" voltage is used herein.

As seen in FIGS. 10a and 10b, the low turn-on voltage and leakage power trade-off of TFET design was compared with multiple Si FinFET models with different values of $V_{th}$. With regard to FIGS. 10a and 10b, a high-$V_{th}$ and low-$V_{th}$ represent a +0.05V and −0.05V $V_{th}$ shift, respectively, compared to a nominal Si FinFET case, where the Equivalent Oxide Thickness ("EOT") and Channel Length, $L_g$, are 0.7 and 20 nm, respectively. Further, device simulation parameters for the comparison described herein are shown below in Table 1:

TABLE 1

| | |
|---|---|
| Channel Length ($L_g$) | 20 nm |
| EOT (HfO$_2$) | 0.7 |
| HTFET Device Body Thickness ($t_{Body}$) | 7 nm |
| Si FinFET Fin Width ($W_{Fin}$) | 10 nm |
| n-type HTFET Source (GaSb) Doping | 4 × 10$^{19}$ cm$^{-3}$ |
| n-type HTFET Drain (InAs) Doping | 2 × 10$^{17}$ cm$^{-3}$ |
| Si FinFET Source/Drain Doping | 1 × 10$^{20}$ cm$^{-3}$ |

HTFET Material Bandgap ($E_g$) and Hetero-Interface Band Alignment ($\Delta E_c$): $E_{gGaSb}$ = 0.804 eV, $E_{gInAs}$ = 0.44 eV, $\Delta E_c$ = 0.796 eV The simulation parameters used for the baseline rectifier design are C1, C2, CL equal to 10 picofarads, the load resistance RL equals 10 kΩ, $W_n$=0.1 μm, $W_p$=0.2 μm, for a single stage. The rectifier topology was analyzed under the condition that perfect impedance matching is obtained in order to evaluate the intrinsic performance of the rectifier designs. FIGS. 10a and 10b demonstrate the DC output voltage performance comparison of HTFET rectifier with a Si FinFET rectifier having a standard threshold voltage, labeled as SVT, having a low threshold voltage, labeled LVT, and high threshold voltage, labeled HVT.

As seen in FIG. 10a, an HTFET rectifier has a larger DC output voltage than the Si FinFET options at input voltage ranges up to around 0.4V. At an input voltage of 0.1 V, the DC output voltage of the HTFET rectifier is approximately 95 times that of the LVT Si FinFET, approximately 488 times to that of the SVT Si FinFET, and approximately 1587 times that of the HVT Si FinFET. In spite of tuning the threshold voltage of a Si FinFET rectifier, the HTFET rectifier has better performance for weak RF input signals. It is observed that the performance of an HTFET rectifier is superior until around an input voltage of 0.4V. Beyond that point, Si FinFET rectifiers typically have better performance with increasing RF input levels. This is because tunneling currents that are effective in an HTFET are limited above input voltages around 0.4V.

FIG. 10b shows the DC output power performance comparison of an HTFET rectifier with Si FinFET rectifier with the three different Si FinFET device options discussed above. Since the DC output voltage of an HTFET rectifier is large for a given load, DC output power is also higher compared to using a Si FINFET for most of the range of RF input voltages, $V_{AC}$, considered. At an input voltage of roughly 0.4V amplitude, a single stage HTFET rectifier can provide a DC output power of approximately 3.5 μW, whereas the LVT Si FinFET rectifier will provide approximately 2.2 μW, the SVT Si FinFET rectifier will provide approximately 1.8 μW, and the HVT FinFET rectifier will provide approximately 0.4 μW.

Optimization: Frequency

In addition to the size of the coupling capacitors, the size of transistor elements, and the number of stages of a rectifier, the frequency of an RF input signal will also affect the performance of a TFET rectifier. At 100 MHz, TFET rectifier circuit performance is almost similar to that at 10 MHz. With the further increase in frequency up to 1 GHz, the TFET rectifier performance slightly degrades due to the increase in $P_{switching}$. Thus, using TFETs one can design Ultra-High Frequency ("UHF") RFID rectifiers for increased communication range with a slightly reduced performance. In addition, the load resistance of a TFET rectifier will affect performance. With an increase in the load resistance, the rectified DC output voltage increases slightly. Since the load current also reduces for greater values of load resistance, the rectified DC output power is nearly the same and has similar PCE values. At an RF input voltage of 0.4V, for a load resistance equal to 10 kΩ, the DC output voltage is around 0.111, while at a load resistance of 100 kΩ, the DC output voltage is 0.232V. Further, at a load resistance of 1000 kΩ, the DC output voltage is 0.264V for a TFET rectifier according to the parameters above.

Optimization: Multi-Stage

Additionally, multi-stage configurations of a TFET rectifier can achieve large output DC voltages when serially stacked along a DC path and connected in parallel to the input RF terminals. FIGS. 11a and 11b present the DC output voltage and DC output power of a TFET rectifier with 1, 4 and 10 stages, respectively, where the topology of a single rectifier stage is shown in FIG. 3. Multi-stage topology significantly increases the DC output of TFET rectifier. According to design analysis, a 4 stage TFET rectifier demonstrates an improvement of 1.3 times the DC output voltage of a single stage device at an input voltage of $V_{RF}$=0.35V AC and a 10 stage TFET rectifier demonstrates an improvement of 5.3 times the DC output voltage of single stage device at an input voltage of $V_{RF}$=0.35V AC.

DC output power also improved for a multi-stage rectifier design compared to a single stage design. A 4 stage TFET rectifier saw an improvement of 1.7 times the DC output power at an input voltage of $V_{RF}$=0.35 VAC compared to a single stage device and a 10 stage TFET rectifier saw an improvement of 28.6 times the DC output power at an input voltage of $V_{RF}$=0.35V AC compared to a single stage device. However, due to increased losses, the PCE for a 10 stage TFET rectifier decreased from 98% to 93% when compared to a single stage device. Similarly, a significant improvement in the DC output power of 10-stage TFET rectifier was observed in comparison to single and 4-stage TFET rectifier. Similar analysis was carried out for a 15 stage device, but the improvement is not as drastic.

Optimization: Coupling Capacitors

The capacitors C1 and C2 shown in FIG. 3 may be considered to be coupling capacitors and they strongly affect the rectifier input impedance and thus rectifier output. With the increase of coupling capacitance, the rectifier input impedance is reduced and thus more input current flows through the TFET devices. And while the on-resistance induced thermal power loss, $P_{Ron}$ increases conduction losses, the DC output voltage and power also increase. The device capacitance switching induced dynamic power, $P_{switching}$, also increases with larger coupling capacitors. However, once $P_{switching}$ becomes comparable with $P_{Ron}$, the performance of the rectifier based on DC power output characteristics goes down. In a preferred embodiment, the first and second capacitors C1 and C2 have a value of 10 femtofarads.

Optimization: Transistor Components

Transistor component sizing also plays a role in a rectifier design. A larger width to length device ratio leads to larger device capacitances, because of larger device capacitance switching induced dynamic power, $P_{switching}$, and smaller on-resistance, $R_{on}$. By increasing switching, transistor sizing, DC output voltage and power increases, as long as switching losses are a small fraction of the on-channel conduction losses. Once the switching losses become comparable to conduction losses, increases in transistor sizing offer little to no improvement on the DC output characteristics.

10 Stage Optimized Device

Figure 12:
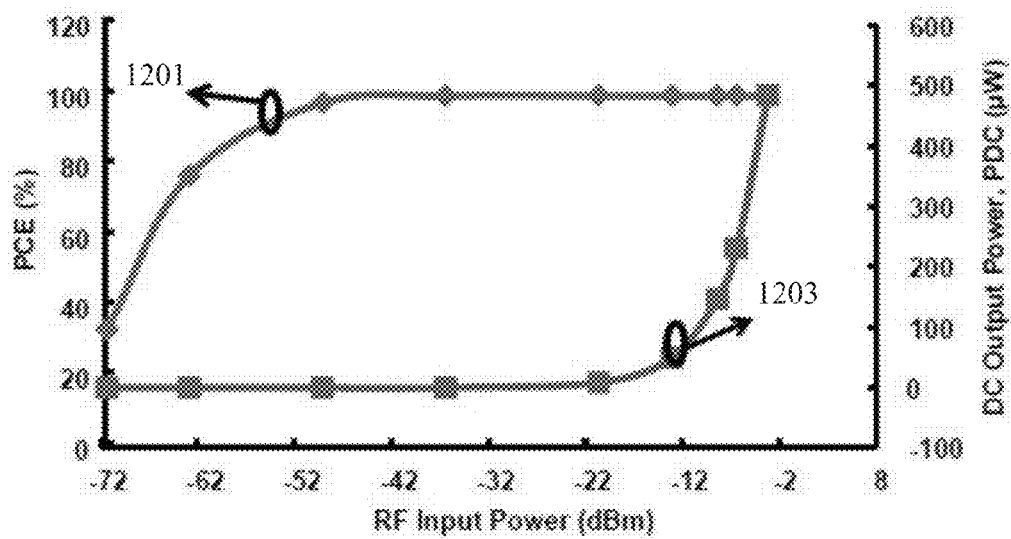
FIG. 12 is graph of a comparison of Power Conversion Efficiency ("PCE") and DC output power variation of a 10 stage TFET Rectifier embodying the present invention and a 4 stage TFET embodying the present invention under optimal conditions.

Design optimization has been performed for a 10 stage TFET rectifier at 915 MHz with a ratio of $W_p$ to $W_n$ equal to 1; $W_p$ and $W_n$ equal to 0.75 μm; C1, C2, and CL all equal 10 femtofarads; and the load resistance, RL, equal to 10KΩ based on design exploration according to the analysis described above. FIG. 12 demonstrates the variation of PCE and DC output power of a 10-stage TFET rectifier for varying RF input power levels. The top line 1201 in FIG. 12 represents PCE vs. RF input power, and the bottom line 1203 represents DC output power vs. RF input power. The PCE values and DC output power both vary with the RF input power. Thus, for RF input power levels of −72 dBm to −36 dBm, the DC output power level varies from 73 pW to 0.2 μW with significant improvement in PCE. From −36 dBm to −13 dBm input levels, there has been a significant increase in output power, from 0.2 μW to 50 μW. This shows one can achieve good communication range of approximately 10-100 meters with increased sensitivity values using a multi-stage TFET rectifier.

As shown in Table 2, using the 10-stage rectifier for $V_{in,\ AC}$=0.1V, the optimized TFET rectifier has 8.4 times larger DC output voltage than a baseline TFET rectifier. The baseline TFET rectifier ("Non-Optimized" in Table 2) refers to a 10-stage TFET rectifier with transistor size that has a ratio of $W_p$ to $W_n$ equal to 2; $W_p$ and $W_n$ equal to 0.1 μm; C1, C2, and CL all equal 10 picofarads; and the load resistance, RL, equal to 10KΩ. The baseline TFET rectifier operates at a frequency of 915 MHz.

TABLE 2

| Case | $V_{DC}$(V) ($V_{in}$ = 0.1 V) | $P_{DC}$ (μW) | PCE (%) | 0.3 $V_{DC}$ Sensitivity (dBm) | RF Range (m) |
|---|---|---|---|---|---|
| Non-Optimized | 0.042 | 0.18 | 93 | −20 | 20 |
| Optimized | 0.354 | 12.5 | 98 | −24 | 30 |

For the same conditions, the optimized TFET rectifier has 69.5 times larger DC output power than un-optimized one. Also, the power consumption of the un-optimized TFET rectifier is approximately 13.4 nW and that of the optimized one is approximately 0.46 nW. For the rectifier that can produce a DC output voltage of 0.3V, driving a load of 10KΩ (with a load current of 30 μA), minimum DC output power will be around 9 μW. The optimized rectifier is able to achieve this with a sensitivity of −24 dBm and the non-optimized rectifier has a sensitivity of −20 dBm. This means the optimized TFET rectifier can have the similar performance at around 30 m RF communication range in comparison to the un-optimized one operating at around 20 m communication range.

The communication range using a TFET rectifier for passive RFIDs can be further increased using more rectifier stages and following the optimization procedure described above. Table 3 summarizes the performance and benchmarking of optimized TFET rectifier with published data. The Friis equation was used to estimate communication range. With the 10-stage optimized TFET rectifier, 98% of PCE with 0.5 nW of power consumption, sensitivity of −24 dBm for 9 μW $P_{DC}$ (which corresponds to a free-space communication range of around 30 m) and sensitivity of −33 dBm for 0.4 μW $P_{DC}$ (which corresponds to a free-space communication range of around 90 m) was achieved.

TABLE 3

| | K. Kotami | M. Ghovanloo | P. Asbeck | R. Sarpehkar | D. Wentzloff | This work |
|---|---|---|---|---|---|---|
| Technology | 0.18 μm CMOS | 0.5 μm CMOS | 0.25 μm CMOS | 0.18 μm CMOS | 0.13 μm CMOS | 20 nm HTFETs |

TABLE 3-continued

| | K. Kotami | M. Ghovanloo | P. Asbeck | R. Sarpehkar | D. Wentzloff | This work |
|---|---|---|---|---|---|---|
| Device $V_{th}$ (V) | 0.437/−0.450 | 0.75/−0.9 | 0.4/−0.4 | 0.1/−0.29 | LVT, ZVT, ZVTDG | ~0.110 |
| Year | 2009 | 2013 | 2010 | 2007 | 2012 | 2013 |
| Rectifier Topology | 4-T Differential drive | Active Voltage doubler | 4-T Modified differential-drive | 4-T Modified differential-drive | 2-T Dickson multiplier | 4-T Differential Drive |
| RF input power (μm) | 114 | 7300 | ~91 | 10-200 | 0.1-2.5 | 7 pW-500 μW |
| $V_{RF}$(V) | — | 1.46 | 0-1.8 V | — | — | 0.010-0.5 V |
| DC output voltage (V) | 0.8 | 2.4 | (0-2.6 V) 1.4 V | 0.5 | 0.2-2.6 | 0.5 mV-2.2 V |
| DC output power (μw) | 64 | 5800 | ~65 | 5 | ~100 | 25 pW-484 μW |
| RF Frequency (MHz) | 953 | 13.56 | 915 | 900 | 915 | 915 |
| RL (kΩ) | 10 | 1 | 30 | 1000 | 1000 | 10 |
| $C_{in}$ and $C_L$ | 1.13 pF/1.13 pF | 1 μF/1 μF | Nil/0.5 pF | —/1.19 $_p$F | 1 pF/1 pF | 10 fF/10 fF |
| Power Consumption(μw) | 1 stage (38 μW) | 800 | ~25 | — | — | 0.5 nW |
| Number of stages | 1.3 | — | — | 2 | 30, 50, 70 | 10 |
| Peak PCE (%) | 67.5 | 79 | 71.5 | — | — | 98 |
| Sensitivity (dBm) | −12.5 | ~+8.6 | −4 | −24.7 | −32 with 50 stages | −24 for 9 μW $P_{DC}$−33 for 0.4 μW $P_{DC}$ |
| RF range (m) (For 4W EIRP) | 8.7 | ~0.0007 | ~3 | 26 | 66 with 50 stages | 30 for 9 μW $P_{DC}$ 90 for 0.4 μW $P_{DC}$ |
| Charging Time (s) | — | — | — | — | 155 ms for 50 stages | 0.4-0.6 μs for 1 stage and few μs for 10 stages |

Further information about' the power rectifier of the present invention is disclosed in our article "Tunnel FET based ultra-low power, high sensitivity UF RID rectifier," published in 2013 *IEEE International Symposium on Low Power Electronics and Design (ISPLED)*, pp 157-162, September 2013, which is incorporated herein by reference.

Figure 13:
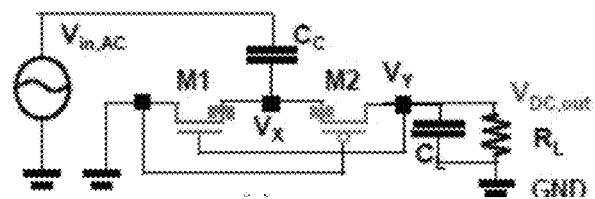
FIG. 13 is a circuit diagram of another TFET rectifier embodying the present invention.

FIG. 13 is a diagram of a second present preferred HTFET RF rectifier and shows the H2T SVC rectifier using HTFETs which employs a known CMOS design. This topology is derived from the conventional diode-connected rectifier, except that it uses the DC output voltage VDC,out to statically "cancel" the threshold voltages of the transistors. The gates of N-HTFET M1 and P-HTFET M2 are statically biased to the VDC,out and the ground, respectively. During the negative half of the cycle (when the input voltage amplitude VRF,in<0V), M1 switches on as VGS,M1=VDC,out+|VRF, in|>Vth, M1 (Vth,M1 is the turn-on voltage of the M1), while M2 is off. The current flows from VY to VX through the load resistor RL and the virtual ground. Similar operation is applied to the positive half of the cycle for P-HTFET switching-on. Compared to the diode-connected rectifier design, this static bias boosts the VGS of the transistors with |VDC, out| to improve the sensitivity of the weak incoming RF signal, which also effectively reduces the on-state channel resistance Ron power loss accordingly. Note that with the same input voltage amplitude VRF,in, the H2T rectifier has a larger VDC,out than the designs using the differential-drive signals (e.g. the H4T rectifiers). A main drawback in this design is the static voltage bias remains at the transistor off-state, causing an increase of the leakage current and the power loss and hence a relatively low PCE.

Figure 14:
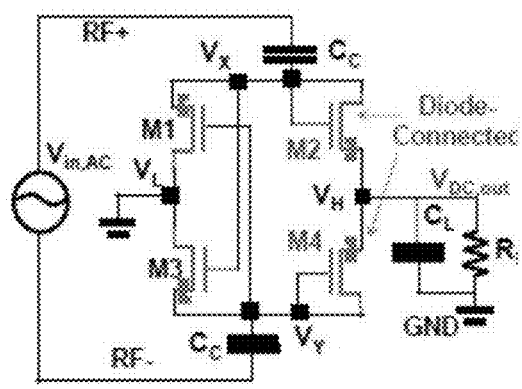
FIG. 14 is a current diagram of yet another TFET rectifier embodying the present invention.
Figure 15:
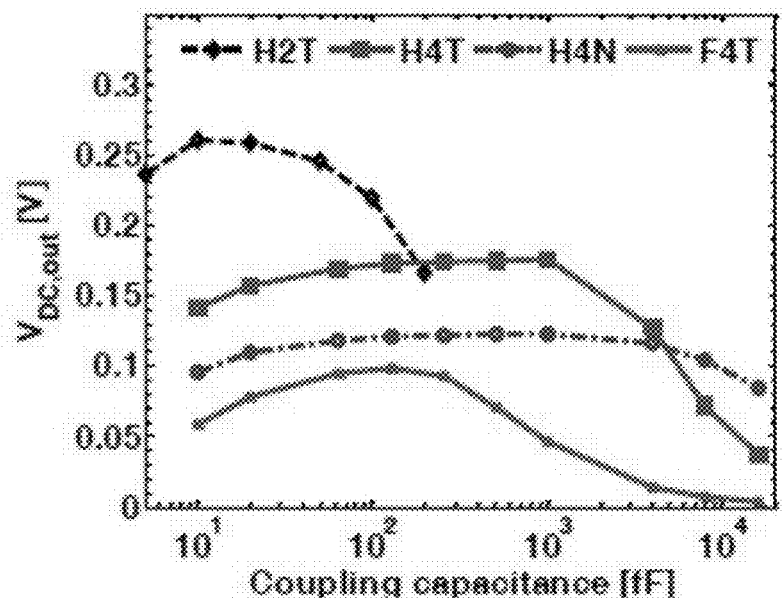
FIG. 15 is a graph of output voltage versus coupling capacitance at 2.0 V input amplitude with 1.0 MΩ $R_L$, 60 nm transistor width for H2T, and 1.5 μm transistor size for others.
Figure 16:
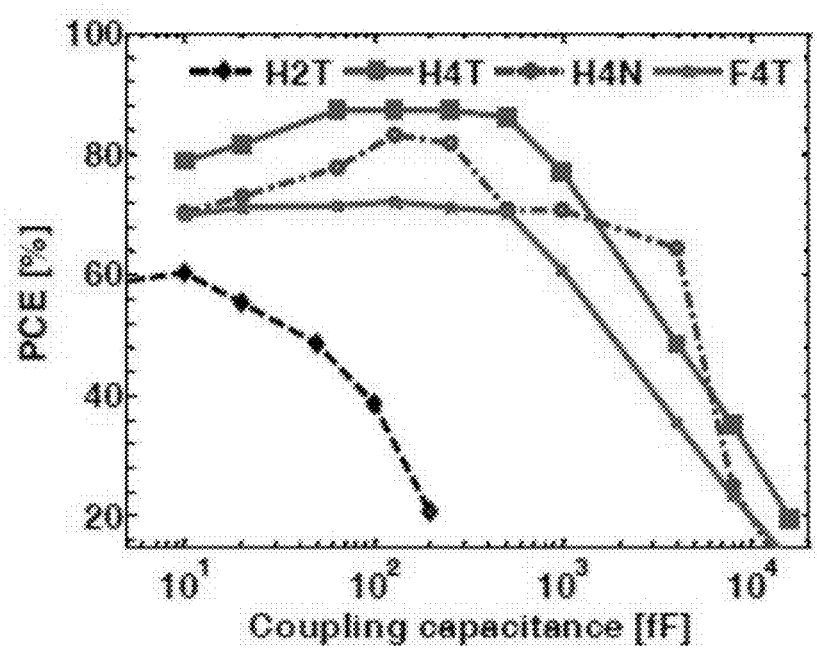
FIG. 16 is a graph of power conversion efficiency (PCE) versus coupling capacitance with 1.0 MΩ $R_L$, 60 nm transistor width for H2T, and 1.5 μm transistor width for others.

FIG. 14 shows a third present preferred HTFET circuit. Given the existing challenges of p-type III-V HTFET development and the degraded SS of P-HTFET, we propose an N-HTFET-only RF rectifier by replacing the P-HTFETs with the diode-connected N-HTFETs as shown in FIG. 14. Such an N-HTFET-only design potentially further improves the performance of the H4T rectifier. The operation of the H4N rectifier is similar as the H4T rectifier, except that the rectifying operation of the P-HTFET in H4T design is completed by the diode-connected N-HTFET. Benefiting from its steep SS characteristics, the reduced turn-on voltage of the N-HTFET also contributes to a smaller turn-on voltage of the diode-connected N-HTFETs and higher sensitivity than the rectifiers using conventional diode-connected MOSFETs. We evaluated the performance of our circuits using DC output voltage $V_{DC,out}$ and PCE with regard to input RF We determined performance evaluation including DC output voltage VDC,out and PCE with regards to the input RF power level for different HTFET rectifier designs, and compare with the baseline F4T Si FinFET rectifier design discussed in Section IV. We focused on examining the design parameters including transistor sizing, coupling capacitance, and their impacts on the peak PCE, VDC,out to seek for the optimal PCE and sensitivity range for energy harvesting applications.

In our simulations, the load resistance RL is set to be 1.0 MΩ, unless specified otherwise. In addition, the load capacitance CL is set to be the same as the input coupling capacitance CC for simulation simplicity.

Transistor Sizing and Coupling Capacitance Optimizations

Figure 17:
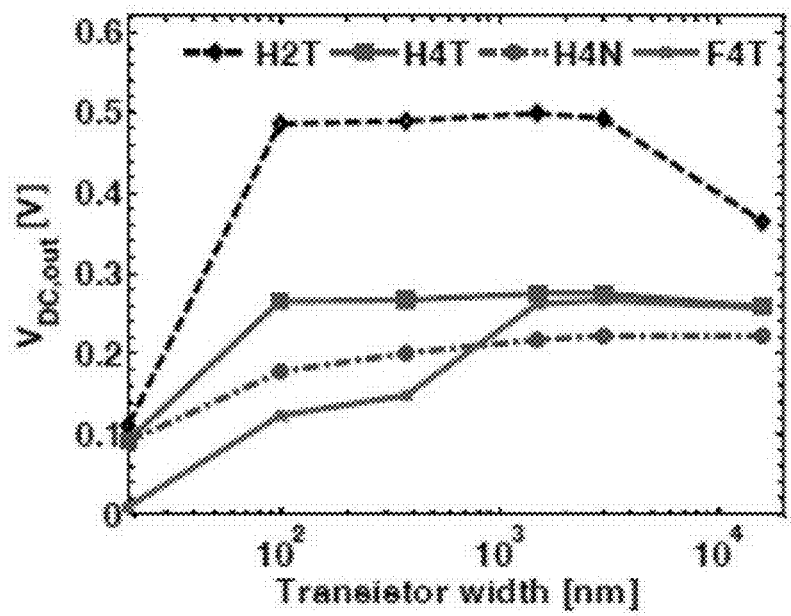
FIG. 17 is a graph of voltage output compared to transistor width at 0.30 V input amplitude with $C_c$=1.0 pF, $R_L$=1.0 MΩ.
Figure 18:
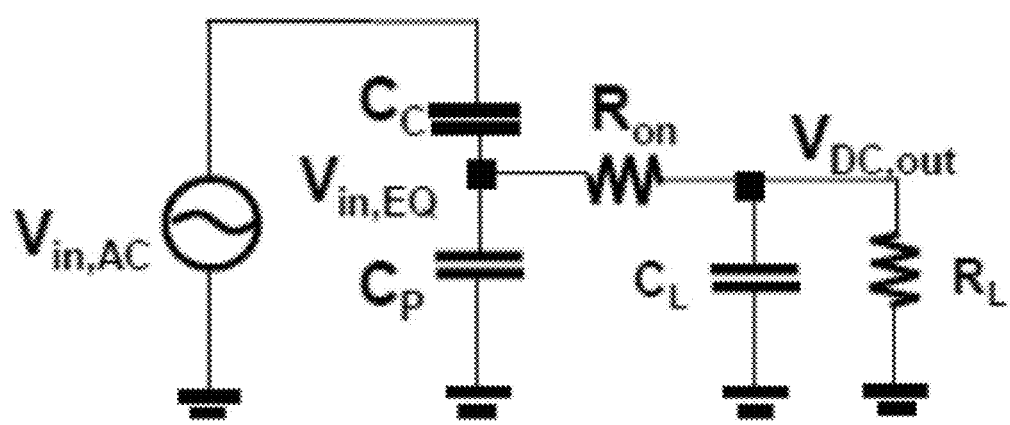
FIG. 18 is a circuit diagram of a capacitive divider model with the rectifier transistor capacitance $C_p$.

The transistor sizing has a strong impact on both the VDC, out and the PCE. The main tradeoff exists between a resistive power loss PResistive due to non-zero on-state channel resistance Ron (decreases with transistor width W) and the other power losses in Eq. (3) due to the transistor capacitance (increases with W). FIG. 17 shows the simulated VDC,out at 0.3 V input versus W for H2T, H4T, H4N, and F4T designs. When W increases, less Ron results in a higher VDC,out with less VDrop, until the transistor capacitance is prominent which limits the equivalent input voltage VIN,EQ. As illustrated in FIG. 18, the equivalent total transistor capacitance CP forms as an AC voltage divider in series with the input coupling capacitance CC, and affects VIN,EQ in the ways of $$V_{IN,EQ} = V_{RF,in} \times \frac{(j\omega C_P)^{-1} \| Z_L}{(j\omega C_C)^{-1} + (j\omega C_P)^{-1} \| Z_L}, \quad (17)$$

$$Z_L = R_{ON} + R_L \| (j\omega C_L)^{-1}. \quad (18)$$

As a result, a large W results in excessive CP, which can lower the VIN,EQ of the rectifier.

Figure 19:
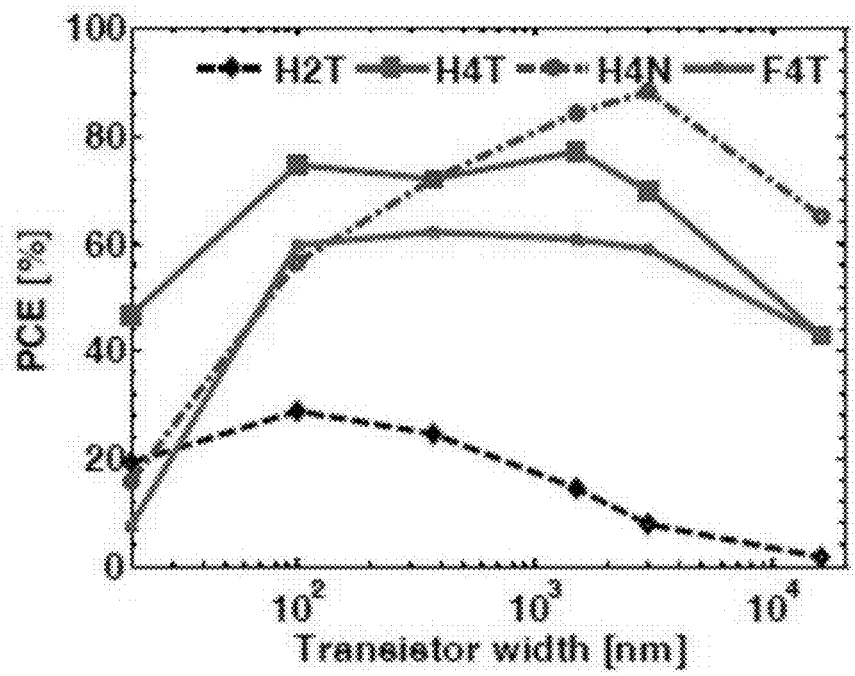
FIG. 19 is a graph of peak power conversion efficiency (PCE) versus the transistor width with $C_c$=1.0 pF, $R_L$=1.0 MΩ.

FIG. 19 shows the impact of W on the PCE. Each point in the PCE curves represents the peak PCE with different RF input power to obtain the optimized transistor width WOPT where the highest PCE occurs. For example, when W is smaller than $W_{OPT}$, PResistive dominates; and when W is larger than $W_{OPT}$, the other power losses in Eq. (3) increase and degrade the PCE. As shown in FIG. 19, the optimum $W_{OPT}$ for the H4T rectifier is smaller than of the H4N rectifier. This is mainly because (1) the H4N rectifier needs a larger transistor W than that of the H4T rectifier to reduce the VDROP across the diode-connected N-HTFETs, and (2) the diode-connected N-HTFET has less capacitance than the transistor connected N-HTFET arising from the dominant CGD in HTFET (Section III.C). When shorting the gate and the drain terminals, CGD=0 reduces the total capacitance, leading to less PSwitching and PResistribute. This allows us to choose a larger transistor size in the H4N rectifier design to compensate the increased PResistive from the diode-connected transistor and achieve a comparable PCE with H4T designs at low RF input power.

Figure 20:
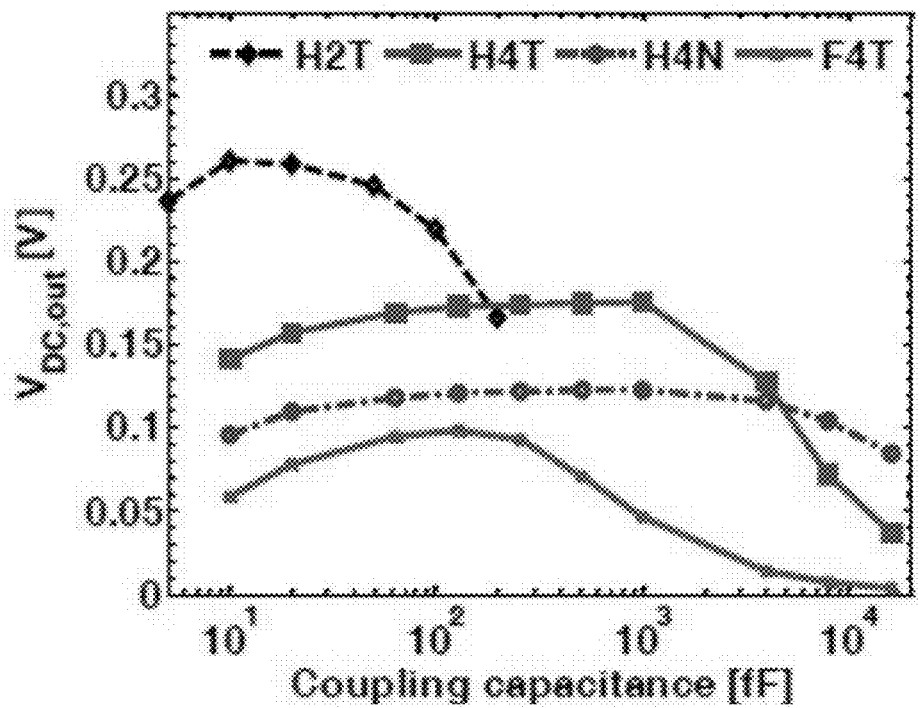
FIG. 20 is a graph of output voltage compared to coupling capacitance at 0.20 V input amplitude with 1.0 MΩ $R_L$, 60 nm transistor width for H2T, and 1.5 μm transistor size for others.
Figure 21:
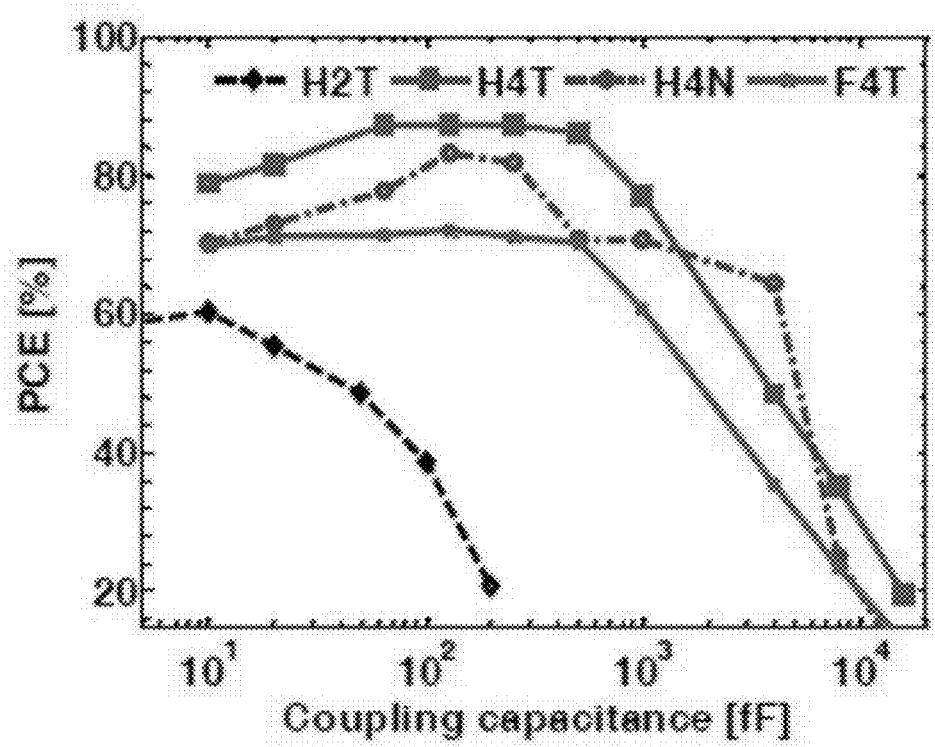
FIG. 21 is a graph of power conversion efficiency (PCE) compared to coupling capacitance with 1.0 MΩ $R_L$, 60 nm transistor width for H2T and 1.5 μm transistor size for others.

FIG. 20 and FIG. 21 illustrate the VDC,out and PCE dependence on the coupling capacitance CC, respectively. The impact of CC on the rectifier can also be related to Eq. (17). When CC is small, VIN,EQ decreases resulting in a low VDC,out and PCE. On the other hand, when the Predistribute becomes dominant as CC increases both VDC,out and PCE decrease which degrade the performance. This analysis agrees with the simulation results in FIG. 20 and FIG. 21 for all evaluated topologies. Note that at a given VRF,in, the H2T rectifier design exhibits a relatively large VDC,out and a degraded PCE compared to the other 4-T designs, which is expected.

Figure 22:
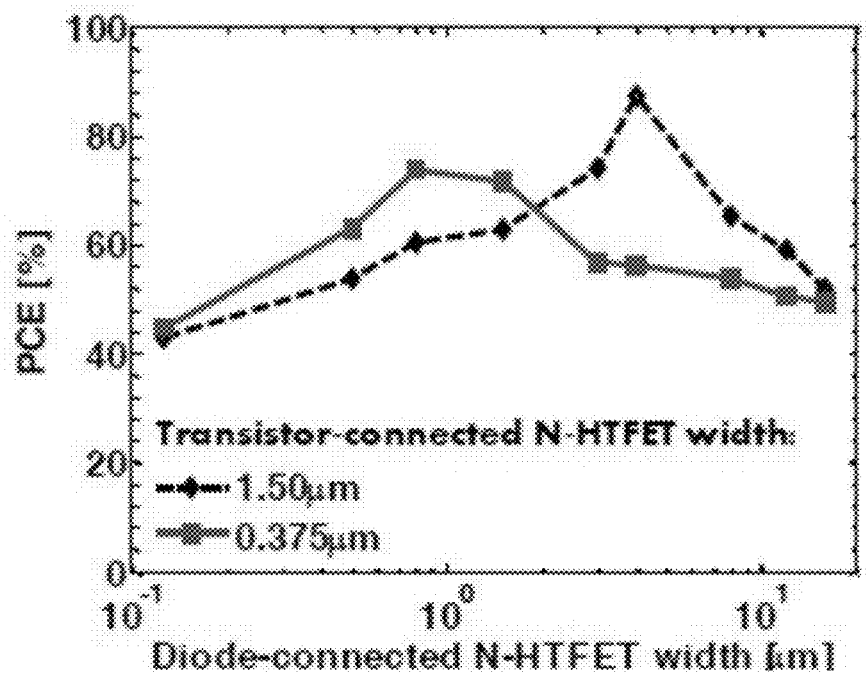
FIG. 22 is a graph of power conversion efficiency (PCE) compared to diode width with $C_c$=1.0 pF, $R_L$=1.0 MΩ.

Given that the H4N rectifier has two diode-connected N-HTFETs, the transistor size of the diode-connected and transistor-connected N-HTFETs should be optimized simultaneously to obtain the highest PCE. FIG. 22 illustrates the maximum PCE when varying the width of the diode-connected N-HTFET (WD) in the H4N rectifier. Hence, a WT/WD ratio of 1.5 μW/4 μm is applied for the optimal performance.

Based on the evaluations of the transistor sizing and coupling capacitance effects, we use the following design parameters for each rectifier topology for optimized performance: For H2T, CC=0.2 pF, W=0.5 μm. For H4T, CC=1.28 pF, W=5 μm; For H4N, CC=2.56 pF, WT=15 μm, WD=40 μm; For F4T, CC=5.12 pF, W=5 μm. RL=100 kΩ is used in the following evaluations.

Single-Stage DC Output Voltage and PCE Comparisons

Figure 23:
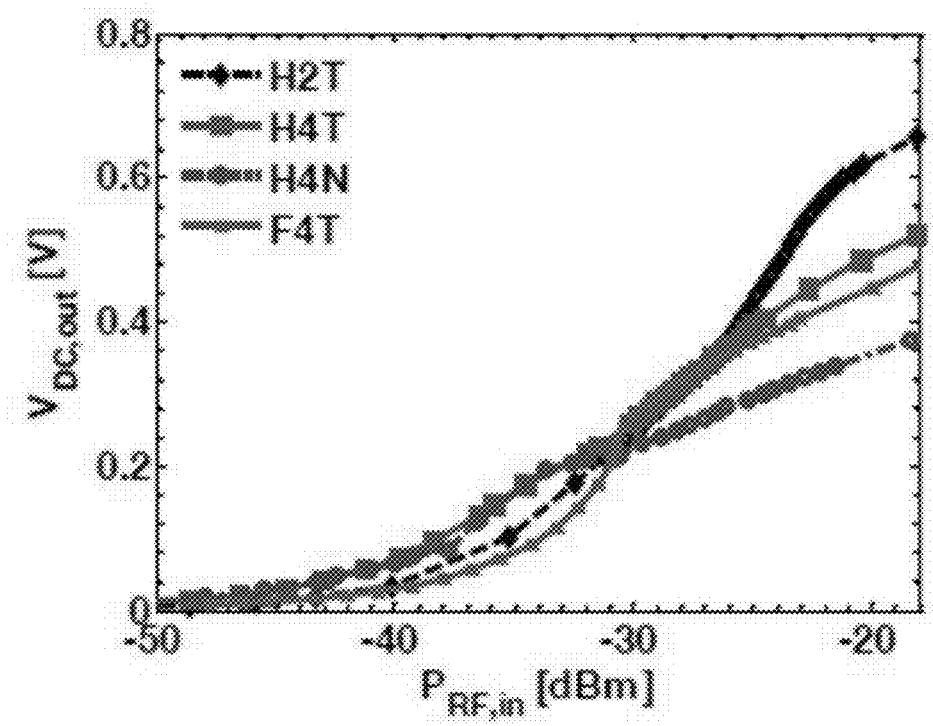
FIG. 23 is a graph of output voltage compared to RF input power for optimized single-stage rectifiers with 100 kΩ $R_L$.
Figure 24:
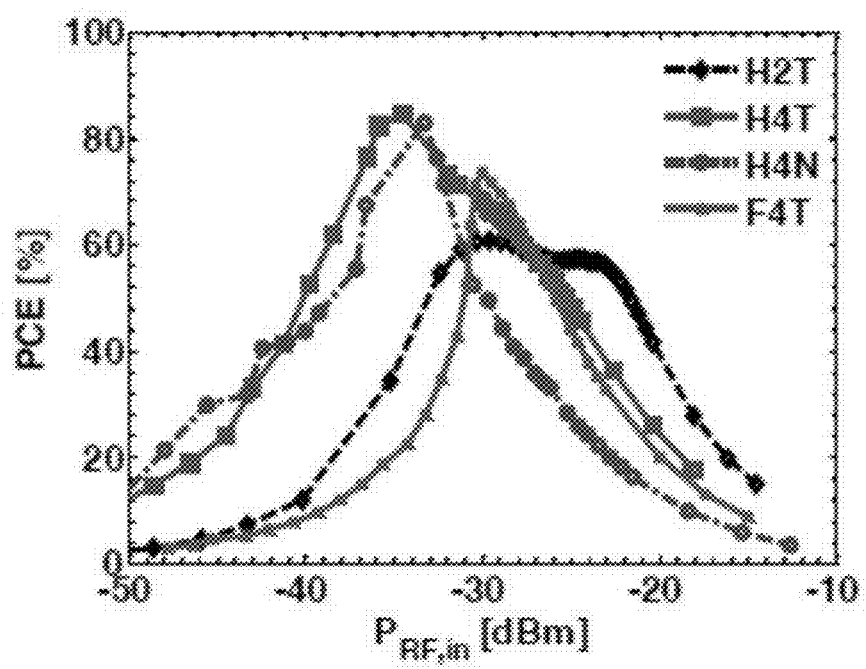
FIG. 24 is a graph of power conversion efficiency (PCE) compared to RF input power for optimized single-stage rectifiers with 100 kΩ $R_L$.

The VDC,out and PCE comparisons between the optimized rectifiers with different topologies are shown in FIG. 23 and FIG. 24 (with RL=100 k≠), respectively. When the input power PRF,in is lower than −30 dBm, the H4T and H4N rectifiers show higher VDC,out than the F4T rectifier. As PRF,in increases, a cross-over of the VDC,out occurs, where F4T rectifier shows a comparable VDC,out with H4T but higher than H4N. This is consistent with the analysis in Section IV. With a low PRF, in, the reduced turn-on voltage and reduced Ron of the HTFET results in a higher VDC,out in the HTFET rectifier than that in the Si FinFET rectifier. As PRF,in increases, VDC,out of F4T is comparable with that of H4T and H4N due to improved on-state current of Si FinFET at higher input voltages, but also increases the reverse conduction induced power loss. As a result, VDC,out of H4T is comparable or even higher than that of F4T, benefited from its uni-directional conduction. Comparing the H4T and H4N designs, the optimized H4N shows a comparable VDC,out at lower PRF,in, but a lower VDC,out than the optimized H4T at higher PRF,in. This result is expected given the large transistor sizing of H4N as discussed in Section V.A, which complies with our design goal of optimal PCE at a low PRF,in.

For the H2T rectifier, a lower VDC,out is observed when the given PRF,in is low compared to the H4T and H4N rectifiers, due to the inherent leakage power loss from the static gate-bias. As PRF,in increases to above −25 dBm, H2T rectifier shows a substantial increase of VDC,out compared to the others. This is because of the power loss reductions (including PSwitching and PRedistribute) benefited from less and smaller transistors. At a high PRF,in, the PResistive contribution is reduced due to the increased VRF,in, while the other power losses (see Eq. (3)) become dominant. Thus, the reduced power losses in the optimized H2T rectifier leads to a higher VDC,out for H2T in the high PRF,in range.

Similarly to VDC,out, the PCE of the H4T and H4N rectifiers is significantly improved compared to that of the F4T rectifier, especially when PRF,in is lower than −31 dBm (FIG. 24). For the F4T rectifier, the peak PCE of 73.5% is achieved at −30 dBm PRF,in, but drops significantly as PRF,in approaches to the lower range. When PRF,in is −35 dBm (0.32 μW), the PCE of the F4T rectifier drops below 21% (PDC,out of 0.067 μW), where the H4T and H4N rectifiers reach the peak PCE of 85% and 84% (PDC,out of 0.27 μW), respectively, which is desired for the ambient RF power harvesting applications. The H2T rectifier shows a degraded peak PCE (61%) compared to the other designs, but still outperforms the F4N at the lower PRF,in (following the VDC, out trend). At PRF,in above −25 dBm, the reduced capacitive loss continues to benefit the PCE of the H2T rectifier with a highest upper PRF, in limit to −22 dBm.

Multiple-Stage Design Considerations

Figure 25:
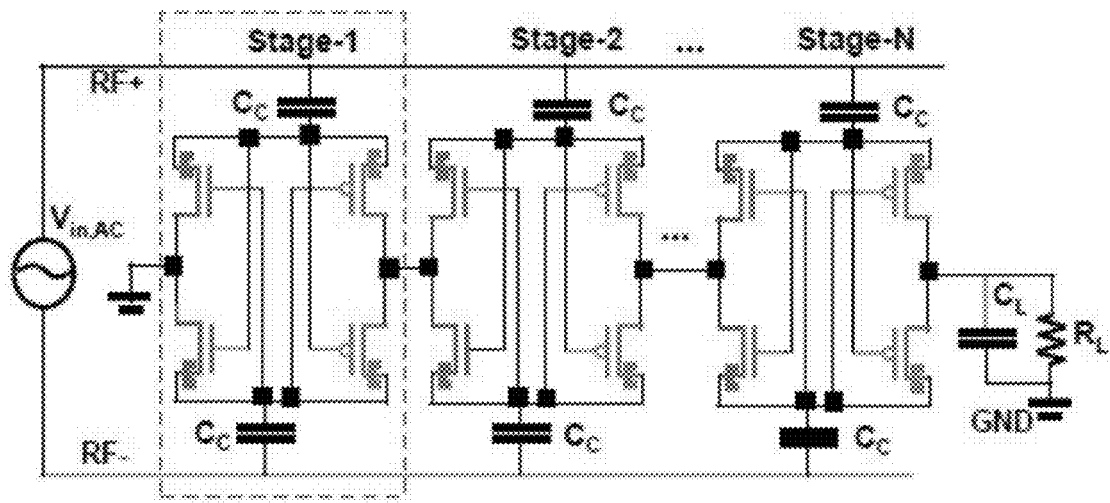
FIG. 25 is a circuit diagram of a multiple—stage rectifier using H4T design in accordance with the present invention.

For higher VDC,out, multiple-stage rectifiers are usually employed at the cost of PCE degradation due to extra power loss from additional stages. FIG. 25 illustrates a multiple-stage rectifier configuration using the H4T. Similar connections can be applied to the other topologies. A coupling capacitor (CC) is required for each stage for DC blocking. It is important to note that the input capacitance of a multiple-stage rectifier is N-times that of a single-stage rectifier, where N represents the number of stages. This is because the input coupling capacitors CC of all stages are all connected to the RF input ports. As a result, the input impedance of the multi-stage rectifier strongly depends on the coupling capacitors CC.

Figure 26:
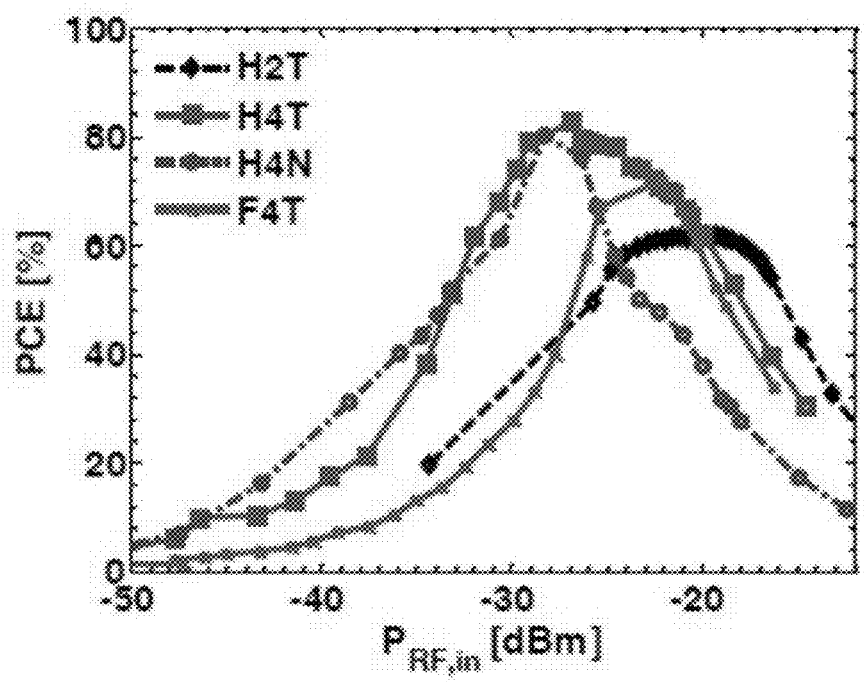
FIG. 26 is a graph of power conversion efficiency (PCE) for 2-stage optimized rectifier with 100 kΩ $R_L$.
Figures 27A, 27B:
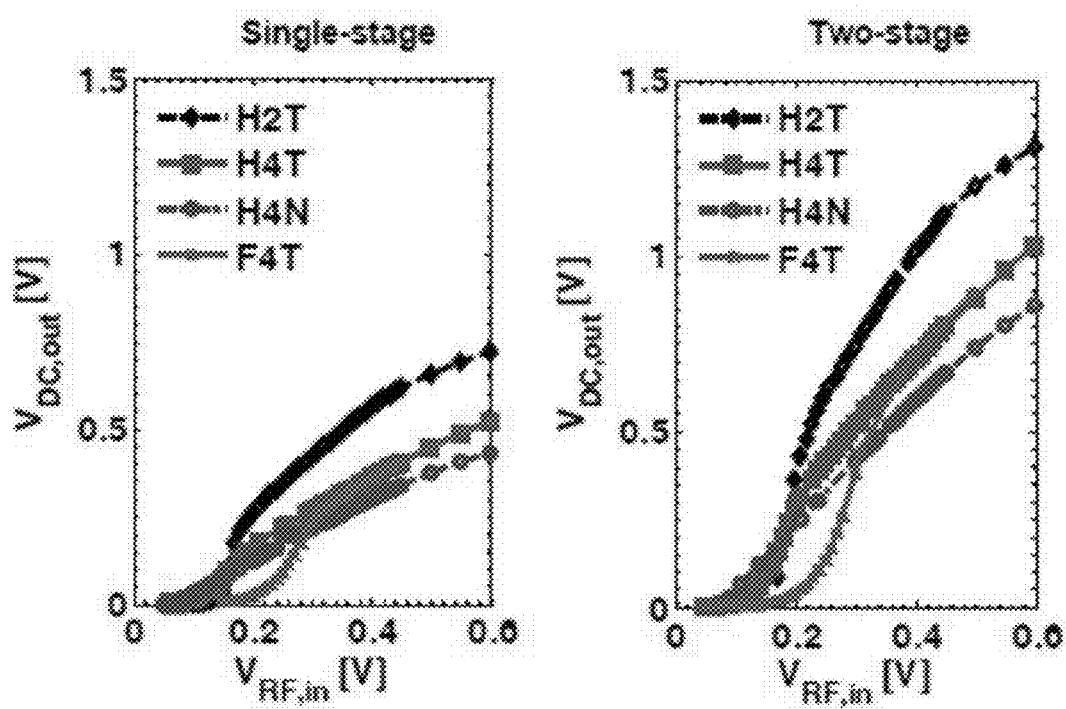
FIG. 27a is a graph of voltage output compared to RF voltage input for a single stage reactive with 100 kΩ $R_L$.
FIG. 27b is a graph of voltage output compared to RF voltage input for 2-stage optimized rectifiers with 100 kΩ $R_L$.

FIGS. 26, 27a and 27b show the VDC,out and PCE comparisons for the 2-stage rectifiers using different topologies. The same design parameters as the optimized single-stage rectifiers in Section V.B are employed with the same RL of 100 kΩ. Peak PCE of 82% and 80% are obtained in the H4T and H4N rectifiers at −27 dBm and −28 dBm PRF,in, respectively, while the 71% peak PCE is achieved in the F4T rectifier at −22 dBm PRF, in. The degraded sensitivity of the 2-stage rectifier designs is due to the effective load change from the rectifier cascading. The advantage of a higher PCE for H4T and H4N preserves for the PRF,in below −26 dBm. Benefiting from the multiple-stage connection, at VRF,in = 0.3V, improved VDC,out of 0.5 V, 0.43 V and 0.75 V are achieved for the 2-stage H4T, H4N and H2T rectifiers, showing approximately 1.92×, 1.86× and 1.78× improvement than that of the single-stage cases, respectively, comparing to the 0.4 V VDC,out with 1.6× improvement obtained for the F4T rectifier. Since the VDC,out of the proposed two-stage HTFET rectifier with over −26 dBm PRF, in is already higher than 0.4 V, which is sufficient for the supply voltage requirement for the HTFET circuits, multiple-stage rectifier designs with more than two stages.

TABLE 4

RF RECTIFIER PERFORMANCE BENCHMARKING*

| Rectifier topology | F4T | H2T | H4T | H4N |
|---|---|---|---|---|
| Process Technology | 20 nm Si FinFET | 20 nm HTFET | 20 nm HTFET | 20 nm HTFET |
| Transistor $V_{th, NFET}$, $V_{th, PFET}$ (V) | 0.21, −0.21 | 0.1, −0.12 | 0.1, −0.12 | 0.1, −0.12 |
| Single-stage $P_{RF}$, in range (dBm) @PCE > 50% | −31~−26 | −33~−22 | −40~−25 | −38.5~−30 |
| 2-stage $V_{DC, out}$ (V) @ $V_{RF, IN}$ = 0.25 V | 0.13 | 0.61 | 0.41 | 0.32 |
| Single-stage $P_{DC, out}$ (μW) @ $P_{RF, IN}$ = −35 dBm | 0.06 | 0.12 | 0.27 | 0.16 |
| Single-stage peak PCE % @ $P_{RF, IN}$ (dBm) | 73.5 @ −30 | 61 @−29.6 | 85 @−34.5 | 84@−33.5 |
| Single-stage sensitivity (dBm) PCE > 50% | −31 | −33 | −40 | −38.5 |

*Data are obtained from simulations with 100 kΩ $R_L$ at 915 MHz RF input.

Table 4 summarizes the performance of the proposed HTFET rectifiers, and the Si FinFET rectifier. Benefited from the reduced threshold voltages of the 20 nm technology, both Si FinFET and HTFET based designs show desired sensitivity down to −31 dBm input power with over 50% PCE, where the 4T HTFET rectifiers (H4T and H4N) exhibit even further improved the sensitivity range compared to the 4-T Si FinFET rectifier. For the single-stage designs, over 50% PCE can be achieved for H4T and H4N designs at the input RF power ranging from −40 dBm to −25 dBm and −38.5 dBm to −30 dBm, respectively, whereas the PCE of the optimized Si FinFET rectifier is less than 50% and drops fast for below −31 dBm input RF power. Although the H2T rectifier shows a degraded peak PCE of 61% compared to the other designs, a wider RF input power range from −33 dBm to −22 dBm for over 50% PCE is still achieved as compared to the F4T design. The significantly boost of the VDC,out can be achieved using the 2-stage configurations. This high PCE of the HTFET rectifiers also leads to an improved DC output power and desired DC output voltage in the low RF input power range, which is appealing to various energy harvesting applications.

The data presented here shows that by taking advantages of the turn-on voltage reduction and drive current improvement at low voltages enabled by the steep subthreshold slope, as well as the uni-directional conduction owning to its asymmetrical source/drain structure, HTFET exhibits superior performance advantages in terms of improving both PCE and sensitivity of the rectifiers to mitigate the technology limitations of conventional CMOS in ambient RF power scavenging. We have presented different HTFET RF rectifier topologies and design optimizations including the 2-T SVC (H2T), 4-T cross-coupled (H4T), and the 4-T N-HTFET-only (H4N) rectifier inspired from the 4-T cross-coupled topology. Evaluations of the optimized single-stage rectifiers have shown that a >50% PCE could be achieved in the H4T rectifier with an RF input power ranging from −40 dBm to −25 dBm, while the PCE of the baseline 4-T cross-coupled FinFET rectifier drops significantly for below −31 dBm input. A maximum PCE of 84% and 85% could be achieved in the proposed H4N at −33.7 dBm input power and H4T at −34.5 dBm input power, respectively. Such superior PCE and sensitivity improvement of the HTFET rectifiers stems from optimizations based on the unique device characteristics, which highlights the steep-slope HTFET as a promising candidate in applications with RF-energy harvesting The exemplary embodiments of the present invention are not limited to the above-described examples and emphasized aspects but, rather, may appear in a large number of modifications that lie within the scope of handling by a person skilled in the art. It will be apparent to those skilled in the art that numerous modifications and variations of the described examples and embodiments are possible in light of the above teachings of the disclosure. The disclosed examples and embodiments are presented for purposes of illustration only. Other alternate embodiments may include some or all of the features disclosed herein. Therefore, it is the intent to cover all such modifications and alternate embodiments as may come within the true scope of this invention, which is to be given the full breadth thereof. Additionally, the disclosure of a range of values is a disclosure of every numerical value within that range.

What is claimed is:
1. A power rectifier comprising:
   a stage comprising:
      a first Tunneling Field-Effect Transistor ("TFET") having a source, a gate, and a drain;
      a second TFET having a source, a gate, and a drain;
      a third TFET having a source, a gate, and a drain; and
      a fourth TFET having a source, a gate, and a drain; and
      wherein the first TFET is a N-type TFET; and
      wherein the second TFET is a P-type TFET; and
      wherein the third TFET is a N-type TFET; and
      wherein the fourth TFET is a P-type TFET; and
      wherein the source of the first TFET, the source of the second TFET, the gate of the third TFET, and the gate of the fourth TFET are connected at a first node; and
      wherein the gate of the first TFET, the gate of the second TFET, the source of the third TFET and the source of the fourth TFET are connected at a second node; and
      wherein the drain of the first TFET and the drain of the third TFET are connected at a third node; and
      wherein the drain of the second TFET and the drain of the fourth TFET are connected at a fourth node.
2. The power rectifier of claim 1, further comprising a first capacitor and a second capacitor, wherein the first capacitor is connected to the first node and wherein the second node is connected to the second capacitor.

3. The power rectifier of claim 2, wherein the first node is an input node configured to receive an alternating signal and wherein a first terminal of the first capacitor is connected to the input node.

4. The power rectifier of claim 2, wherein the first and second capacitors have a value of 10 pF.

5. The power rectifier of claim 2, wherein the third node is connected to ground.

6. The power rectifier of claim 2, wherein the fourth node is connected to a load resistance.

7. The power rectifier of claim 6, wherein a third capacitor is connected in parallel to the load resistance.

8. The power rectifier of claim 1, wherein each of the first TFET, the second TFET, the third TFET, and the fourth TFET is a Hetero-Junction TFET ("HTFET").

9. The power rectifier of claim 1, wherein the stage is a first stage having a first reference voltage node and a second reference voltage node, and the power rectifier further comprising:
  a second stage having a first reference voltage node and a second reference voltage node, the second stage comprising:
    a fifth TFET having a source, a gate, and a drain;
    a sixth TFET having a source, a gate, and a drain;
    a seventh TFET having a source, a gate, and a drain;
    an eighth TFET having a source, a gate, and a drain;
    wherein the fifth TFET is a N-type TFET; and
    wherein the sixth TFET is a P-type TFET; and
    wherein the seventh TFET is a N-type TFET; and
    wherein the eighth TFET is a P-type TFET; and
    wherein the source of the fifth TFET, the source of the sixth TFET, the gate of the seventh TFET, and the gate of the fourth TFET are connected; and
    wherein the gate of the fifth TFET, the gate of the sixth TFET, the source of the seventh TFET and the source of the eighth TFET are connected; and
    wherein the drain of the fifth TFET and the drain of the seventh TFET are connected; and
    wherein the drain of the sixth TFET and the drain of the eighth TFET are connected; and
  wherein the first reference voltage node of the first stage is an input node and the first reference voltage node of the second stage is connected to the input node.

10. The rectifier of claim 9, wherein the source of the first TFET, the source of the second TFET, the gate of the third TFET, and the gate of the fourth TFET are connected to a capacitor.

11. The power rectifier of claim 9, wherein the capacitor is a first capacitor and a second capacitor is connected between the input node of the first stage and the first reference voltage node of the second stage and the first capacitor and the second capacitor are connected in parallel.

12. A power rectifier comprising:
  a multi-stage device having a plurality of stages connected in parallel;
  wherein each stage of the plurality of stages comprising:
    a first Tunneling Field-Effect Transistor ("TFET") having a source, a gate, and a drain;
    a second TFET having a source, a gate, and a drain;
    a third TFET having a source, a gate, and a drain; and
    a fourth TFET having a source, a gate, and a drain; and
    wherein the first TFET is a N-type TFET; and
    wherein the second TFET is a P-type TFET; and
    wherein the third TFET is a N-type TFET; and
  wherein the fourth TFET is a P-type TFET; and
    wherein the source of the first TFET, the source of the second TFET, the gate of the third TFET, and the gate of the fourth TFET are connected; and
    wherein the gate of the first TFET, the gate of the second TFET, the source of the third TFET and the source of the fourth TFET are connected; and
    wherein the drain of the first TFET and the drain of the third TFET are connected; and
    wherein the drain of the second TFET and the drain of the fourth TFET are connected.

13. The power rectifier of claim 11, wherein the plurality of stages is four.

14. The power rectifier of claim 11, wherein the plurality of stages is ten.

15. The power rectifier of claim 11, wherein the plurality of stages is fifteen.

16. A power rectifier comprising:
  a stage comprising:
    a first P-type TFET connected in series with a second P-type TFET;
    a first N-type TFET connected in series with a second N-type TFET;
    wherein the first and second P-type TFET are connected in parallel with the first and second N-type TFET; and
    wherein the first P-type TFET is controlled by a source voltage of the second P-type TFET; and
    wherein the second P-type TFET is controlled by a source voltage of the first P-type TFET; and
    wherein the first N-type TFET is controlled by a source voltage of the second N-type TFET; and
    wherein the second N-type TFET is controlled by a source voltage of the first N-type TFET.

17. The power rectifier of claim 16, wherein the stage is a first stage and the power rectifier further comprising:
  a second stage connected in parallel to the first stage, the second stage comprising
    a first P-type TFET connected in series with a second P-type TFET;
    a first N-type TFET connected in series with a second N-type TFET;
    wherein the first and second P-type TFET are connected in parallel with the first and second N-type TFET; and
    wherein the first P-type TFET is controlled by a source voltage of the second P-type TFET; and
    wherein the second P-type TFET is controlled by a source voltage of the first P-type TFET; and
    wherein the first N-type TFET is controlled by a source voltage of the second N-type TFET; and
    wherein the second N-type TFET is controlled by a source voltage of the first N-type TFET.

* * * * *